(12) United States Patent
Ijima et al.

(10) Patent No.: US 11,171,465 B2
(45) Date of Patent: Nov. 9, 2021

(54) SUBMOUNT FOR SEMICONDUCTOR LASER DEVICE ON HEAT ASSISTED RECORDING DEVICE

(71) Applicant: Panasonic Intellectual Property Management Co., Ltd., Osaka (JP)

(72) Inventors: Shinichi Ijima, Toyama (JP); Kazumasa Nagano, Toyama (JP); Norio Ikedo, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 16/779,065

(22) Filed: Jan. 31, 2020

(65) Prior Publication Data

US 2020/0169059 A1 May 28, 2020

Related U.S. Application Data

(63) Continuation of application No. PCT/JP2018/024074, filed on Jun. 26, 2018.

(30) Foreign Application Priority Data

Aug. 4, 2017 (JP) .............................. JP2017-151533

(51) Int. Cl.
*H01S 5/0237* (2021.01)
*G11B 5/48* (2006.01)
*G11B 5/00* (2006.01)

(52) U.S. Cl.
CPC .......... *H01S 5/0237* (2021.01); *G11B 5/4866* (2013.01); *G11B 2005/0021* (2013.01)

(58) Field of Classification Search
None
See application file for complete search history.

(56) References Cited

U.S. PATENT DOCUMENTS 5,544,184 A * 8/1996 Wolak ................ H01S 5/02326
372/50.23
9,475,151 B1 * 10/2016 Wang ..................... B23K 1/005
(Continued)

FOREIGN PATENT DOCUMENTS

JP 2003-258370 A 9/2003
JP 2009-59788 A 3/2009
(Continued)

OTHER PUBLICATIONS

International Search Report issued in corresponding International Patent Application No. PCT/JP2018/024074, dated Aug. 21, 2018, with English translation.

*Primary Examiner* — Tan X Dinh
(74) *Attorney, Agent, or Firm* — McDermott Will & Emery LLP

(57) ABSTRACT

A submount includes a substrate, the substrate including: a first surface; a second surface that is perpendicular to the first surface; a third surface that is perpendicular to the first surface and the second surface; a fourth surface that is perpendicular to the first surface and the second surface, and is opposed to the third surface; a fifth surface that is perpendicular to the second surface and the third surface, and is opposed to the first surface; a sixth surface that is opposed to the second surface; a first notch part that is provided in a portion at which the second surface and the third surface are adjacent to each other; and a second notch part that is provided in a portion at which the second surface and the fourth surface are adjacent to each other, the first notch part and the second notch part each having a recessed surface.

20 Claims, 33 Drawing Sheets

(56) References Cited

U.S. PATENT DOCUMENTS

| | | |
|---|---|---|
| 2003/0165169 A1 | 9/2003 | Nomoto et al. |
| 2005/0069006 A1* | 3/2005 | Tatsumi ................ H01S 5/2231 372/50.1 |
| 2009/0057856 A1 | 3/2009 | Komoto |
| 2011/0134948 A1* | 6/2011 | Kawakami .......... H01S 5/04252 372/34 |

FOREIGN PATENT DOCUMENTS

| | | |
|---|---|---|
| JP | 2010-010514 A | 1/2010 |
| JP | 2012-114322 A | 6/2012 |
| JP | 2013-004148 A | 1/2013 |
| JP | 2016-103564 A | 6/2016 |
| JP | 2020072254 A * | 5/2020 |

* cited by examiner

SUBMOUNT FOR SEMICONDUCTOR LASER DEVICE ON HEAT ASSISTED RECORDING DEVICE

CROSS REFERENCE TO RELATED APPLICATIONS

This application is a U.S. continuation application of PCT International Patent Application Number PCT/JP2018/024074 filed on Jun. 26, 2108, claiming the benefit of priority of Japanese Patent Application Number 2017-151533 filed on Aug. 4, 2017, the entire contents of which are hereby incorporated by reference.

BACKGROUND

1. Technical Field

The present disclosure relates to a submount, a semiconductor laser device including the submount, and a heat assisted hard disk device including the semiconductor laser device.

2. Description of the Related Art

Conventionally, a submount provided with a substrate for mounting an element such as a semiconductor laser chip has been used. Such a submount is generally formed by dividing a flat substrate using a dicing blade or the like. In the submount formed in this way, burrs may be generated at the time of division. Therefore, a technique for solving the problem of burrs occurring in the submount has been proposed (see, for example, Japanese Patent Application Publication No. 2016-103564).

In the manufacturing method of a submount disclosed in Japanese Patent Application Publication No. 2016-103564, even if burrs are generated on the divided surface, the burrs are trying to be accommodated in a notch part by forming the notch part in a ridge line portion between a divided cross section of the submount and the surface adjacent to the divided cross section.

SUMMARY

However, even the manufacturing method of a submount disclosed in Japanese Patent Application Publication No. 2016-103564 may not sufficiently solve the burr problem. For example, the force may be concentrated on a valley-like portion located at the bottom of the notch part at the time of division, and the submount may be divided at that portion. For this reason, there is a problem in that the dividing section of the submount cannot be accurately controlled, and a desired position and flatness of the dividing section cannot be realized.

The present disclosure has been made to solve such a problem, and an object of the present disclosure is to provide a submount or the like having good accuracy of the position of the dividing surface and good flatness of the dividing surface.

In order to achieve the above object, a submount according to the present disclosure is a submount including a substrate having a first surface on which an element is mounted, the substrate including: a second surface that is disposed in a first direction in an in-plane direction of the first surface and substantially perpendicular to the first surface; a third surface that is substantially perpendicular to the first surface and the second surface; a fourth surface that is substantially perpendicular to the first surface and the second surface and is opposed to the third surface; a fifth surface that is substantially perpendicular to the second surface, the third surface, and the fourth surface and is opposed to the first surface; a sixth surface that is opposed to the second surface; a first notch part that is provided in a portion at which the second surface and the third surface are adjacent to each other; and a second notch part that is provided in a portion at which the second surface and the fourth surface are adjacent to each other, wherein the first notch part and the second notch part have a recessed surface that includes a curved surface.

According to the present disclosure, it is possible to provide a submount or the like having good accuracy of the position of the dividing surface and good flatness of the dividing surface.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
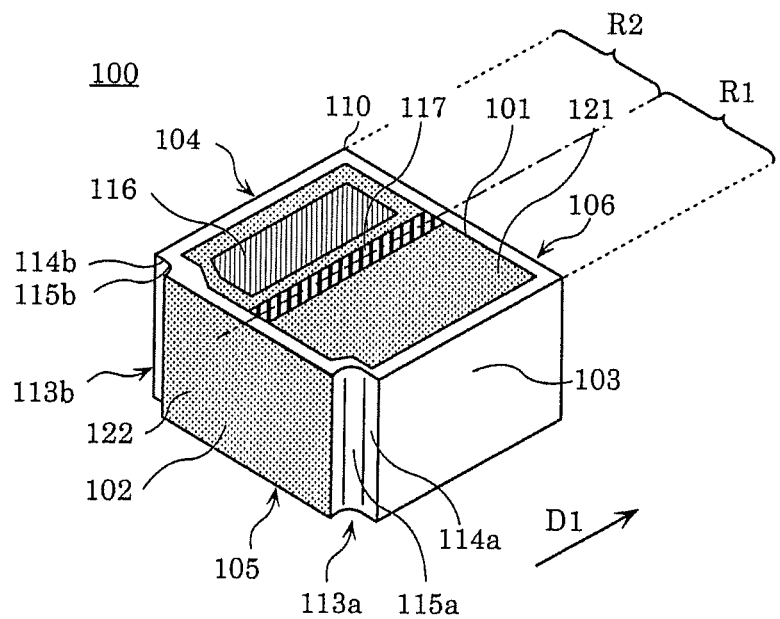
FIG. 1 is a perspective view showing an outline of a submount according to Embodiment 1.

Hereinafter, embodiments of the present disclosure will be described with reference to the drawings. Note that each of the embodiments described below shows a specific example of the present disclosure. Therefore, the numerical values, shapes, materials, components, component arrangement positions and connection forms, as well as steps and order of steps, and the like shown in the following embodiments are merely examples and are not intended to limit the present disclosure. Therefore, components that are not described in the independent claims indicating the highest concept of the present disclosure among the components in the following embodiments are described as arbitrary components.

Each drawing is a schematic diagram and is not necessarily illustrated strictly. Accordingly, the scales and the like do not necessarily match in each drawing. In each drawing, substantially the same components are denoted by the same reference numerals, and redundant descriptions are omitted or simplified.

Embodiment 1

[1-1. Overview of Submount]

First, the outline of the submount according to Embodiment 1 will be described with reference to the drawings.

FIG. 1 is a perspective view showing an outline of submount 100 according to the present embodiment.

Submount 100 according to the present embodiment is a member including substrate 110 for mounting an element such as a semiconductor laser chip.

Substrate 110 is a rectangular parallelepiped member, and is a Si substrate in the present embodiment. The dimension of each side of substrate 110 is, for example, about 0.1 mm or more and 1 mm or less.

As shown in FIG. 1, substrate 110 includes first surface 101, second surface 102, third surface 103, fourth surface 104, fifth surface 105, sixth surface 106, first notch part 113*a*, and second notch part 113*b*.

First surface 101 is a surface on which an element such as a semiconductor laser chip is mounted. Second surface 102 is disposed in first direction D1 in the in-plane direction of first surface 101 and is a surface that is substantially perpendicular to first surface 101. Third surface 103 is a surface that is substantially perpendicular to first surface 101 and second surface 102. Fourth surface 104 is a surface that is substantially perpendicular to first surface 101 and second surface 102 and is opposed to third surface 103. Fifth surface 105 is a surface that is substantially perpendicular to second surface 102, third surface 103, and fourth surface 104 and is opposed to first surface 101. Sixth surface 106 is a surface that is opposed to second surface 102.

Here, "substantially perpendicular" means being substantially perpendicular, and, for example, it means being about 85° or more and 95° or less.

First notch part 113*a* is a concave portion formed in a portion where second surface 102 and third surface 103 are adjacent to each other. Second notch part 113*b* is a concave portion formed in a portion where second surface 102 and fourth surface 104 are adjacent to each other. First notch part 113*a* and second notch part 113*b* each have recessed surface 114*a* that includes curved surface 115*a* and recessed surface 114*b* that includes curved surface 115*b*.

In the present embodiment, submount 100 has first metal film 121 that is disposed on first surface 101, and solder film 116. Solder film 116 is disposed on first metal film 121. Thereby, an element such as a semiconductor laser chip can be bonded via solder film 116.

The configuration of first metal film 121 is not particularly limited. First metal film 121 is, for example, a metal film in which Ti, Pt, and Au are stacked from the substrate 110 side. The film thickness of each layer of Ti, Pt, and Au is, for example, about 0.05 µm or more and 1 µm or less. Each layer of Ti, Pt, and Au functions as an adhesion film, a diffusion prevention film, and an electrode film, respectively.

Furthermore, first metal film 121 is formed with strip-shaped metal film removal portion 117 extending in first direction D1 in the present embodiment. Metal film removal portion 117 is a portion where a part of first metal film 121 is removed. In the present embodiment, metal film removal portion 117 has the Au layer removed from first metal film 121. Solder film 116 is disposed on a fourth surface 104 side with respect to metal film removal portion 117 on first metal film 121. Thereby, when solder film 116 is melted in order to bond the element to submount 100, it is possible to suppress solder film 116 from flowing to a third surface 103 side beyond metal film removal portion 117.

In addition, solder film 116 is disposed at a position on the fourth surface 104 side on first surface 101. In other words, in first region R1 on the third surface 103 side and second region R2 on the fourth surface 104 side formed by dividing first surface 101 so as to have an equal area by a line segment perpendicular to second surface 102, more solder film 116 is disposed in second region R2 than in first region R1. Thereby, the element can be disposed offset on submount 100.

In addition, submount 100 has second metal film 122 that is disposed on second surface 102. Thereby, second surface 102 of substrate 110 can be bonded to another member via solder or the like. The configuration of second metal film 122 is not particularly limited. For example, second metal film 122 may have the same configuration as first metal film 121.

First notch part 113*a* and second notch part 113*b* of substrate 110 will be described in details later.

Note that even when first surface 101, second surface 102, third surface 103, fourth surface 104, fifth surface 105, sixth surface 106, first notch part 113*a* or second notch part 113*b* of the submount is described in the following description, first surface 101, second surface 102, third surface 103, fourth surface 104, fifth surface 105, sixth surface 106, first notch part 113*a* or second notch part 113*b* indicates a configuration that the substrate provided by the submount has.

[1-2. Overview of Semiconductor Laser Device]

Next, an outline of a semiconductor laser device according to the present embodiment will be described. Hereinafter, the semiconductor laser device using submount 100 will be described with reference to the drawings.

Figure 2:
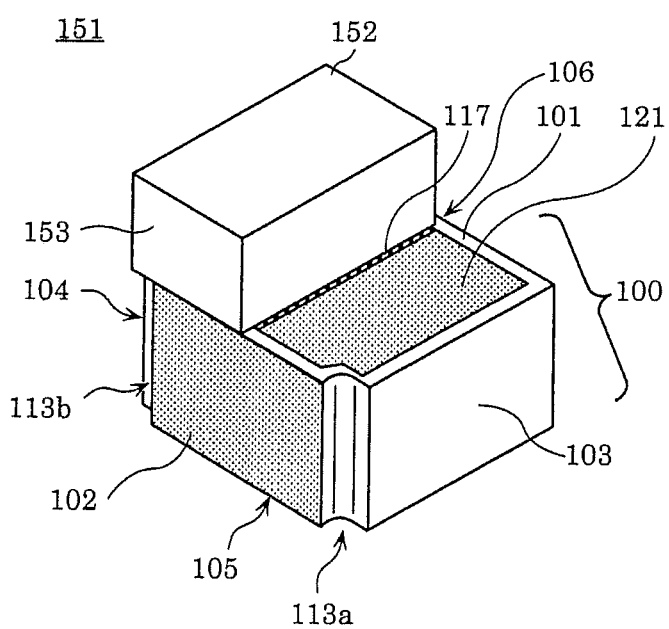
FIG. 2 is a perspective view showing an outline of a semiconductor laser device according to Embodiment 1.

FIG. 2 is a perspective view showing an outline of semiconductor laser device 151 according to the present embodiment. As shown in FIG. 2, the semiconductor laser device 151 according to the present embodiment includes submount 100, and semiconductor laser chip 152 bonded onto first surface 101 of submount 100 via solder film 116.

Semiconductor laser chip 152 is an example of an element mounted on the first surface of submount 100. Semiconductor laser chip 152 is a known semiconductor laser chip including, for example, gallium arsenide or a nitride semiconductor. In the present embodiment, the length of semiconductor laser chip 152 in first direction D1 is about 200 µm or more and 300 µm or less. The length of the semiconductor laser chip in the in-plane direction of first surface 101 of submount 100 and in a direction perpendicular to first direction D1 is about 100 µm or more and 200 µm or less. In addition, emission surface 153 of semiconductor laser chip 152 is disposed on a second surface 102 side of submount 100.

Semiconductor laser device 151 will be described later in details.

[1-3. Overview of Heat Assisted Hard Disk Drive]

Next, an outline of the heat assisted hard disk device according to the present embodiment will be described with reference to the drawings.

Figure 3:
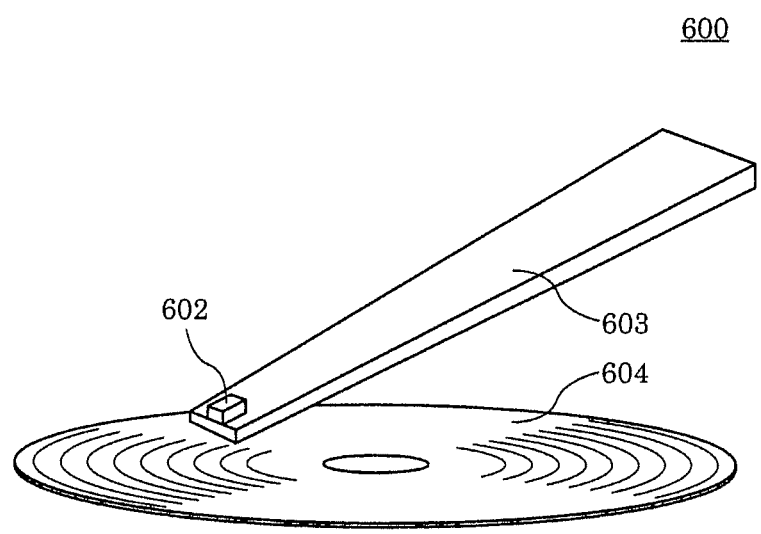
FIG. 3 is a schematic diagram showing an outline of a heat assisted hard disk device according to Embodiment 1.
Figure 4:
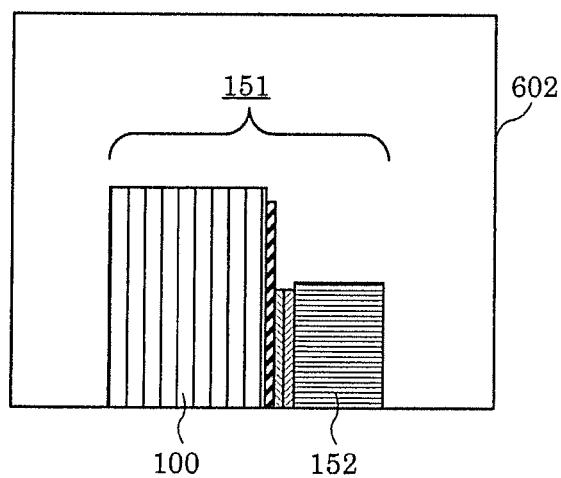
FIG. 4 is a plan view showing a positional relationship between the semiconductor laser device and a slider in the heat assisted hard disk device according to Embodiment 1.

FIG. 3 is a schematic diagram showing an outline of heat assisted hard disk device 600 according to the present embodiment. FIG. 4 is a plan view showing the positional relationship between semiconductor laser device 151 and slider 602 in heat assisted hard disk device 600 according to the present embodiment.

Heat assisted hard disk device 600 according to the present embodiment includes semiconductor laser device 151 described above and slider 602. In addition, heat assisted hard disk device 600 includes suspension 603 and disk 604 as shown in FIG. 3. Note that although not shown in FIG. 3 for simplification, semiconductor laser device 151 is mounted on slider 602 as shown in FIG. 4.

Slider 602 is a plate-like member for stabilizing the distance between a recording head or the like (not shown) that is disposed on slider 602 and disk 604. Slider 602 includes a near-field light generating element (not shown in FIGS. 3 and 4) that guides a laser to generate near-field light.

Suspension 603 is a member that supports slider 602. Disk 604 is a disk-shaped recording medium containing a magnetic material for recording.

In heat assisted hard disk device 600 according to the present embodiment, the magnetic material included in disk 604 is heated by irradiating disk 604 with the laser beam output from semiconductor laser device 151. Thereby, recording on the magnetic material can be assisted.

[1-4. Submount Manufacturing Method]

Next, a method for manufacturing submount 100 according to the present embodiment will be described. Hereinafter, the method for manufacturing submount 100 using a silicon wafer as a base material will be described with reference to the drawings.

Figure 5:
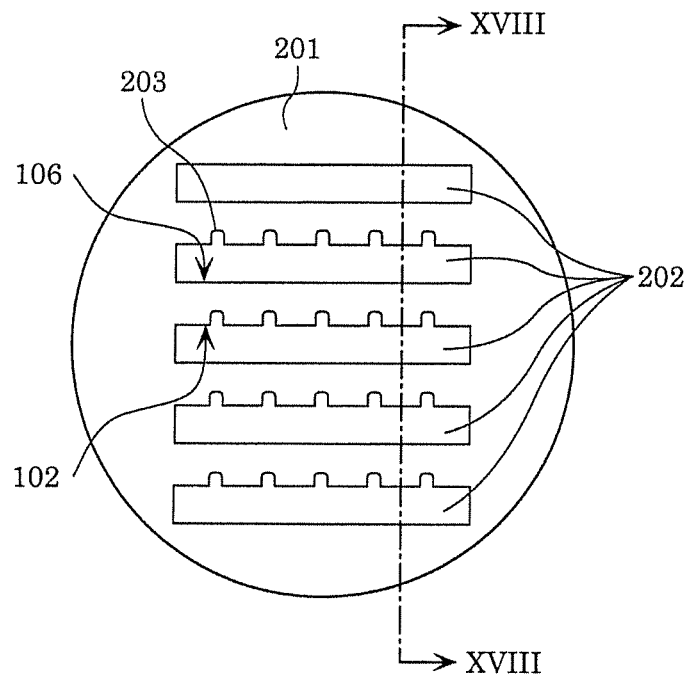
FIG. 5 is a plan view showing a state after an etching process of a silicon wafer according to Embodiment 1.

Silicon wafer 201 having first metal film 121 formed in a predetermined region is prepared. General photolithography and dry etching are performed on silicon wafer 201 provided with first metal film 121 on the main surface to form a plurality of through grooves 202 as shown in FIG. 5. FIG. 5 is a plan view showing a state after the etching process of silicon wafer 201 according to the present embodiment. Second surface 102 and sixth surface 106 of substrate 110 of submount 100 are formed by through grooves 202. In addition, notch shapes 203 corresponding to first notch part 113a and second notch part 113b of substrate 110 are also formed. Second metal film 122 is formed after through grooves 202 are formed.

First metal film 121, second metal film 122, and solder film 116 are formed by a sputtering method or an electron beam evaporation method.

Note that the material for forming substrate 110 of submount 100 is not limited to silicon. For example, substrate 110 may be formed of any of silicon, glass, and silicon carbide.

Next, a step of singulating by dividing silicon wafer 201 will be described. In the present embodiment, silicon wafer 201 is divided by expanding silicon wafer 201 after forming a modified region by irradiating a processing laser to the dividing position of silicon wafer 201. That is, silicon wafer 201 is divided by stealth dicing. Such a singulating step according to the present embodiment will be described with reference to the drawings.

Figure 6:
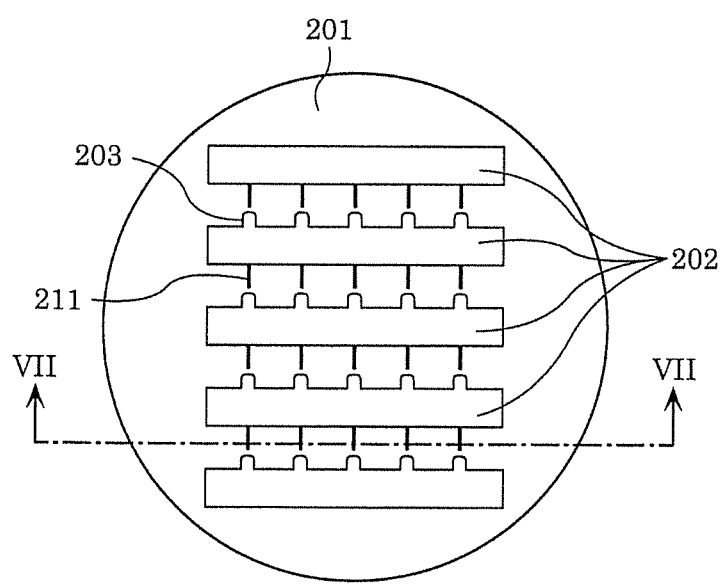
FIG. 6 is a plan view showing a modified region of the silicon wafer according to Embodiment 1.
Figure 7:
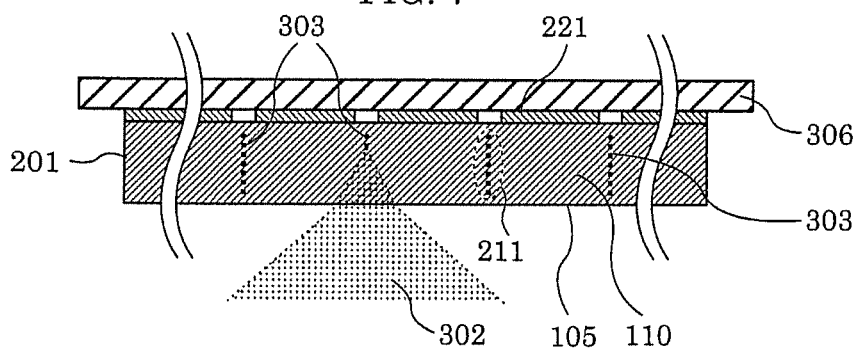
FIG. 7 is a cross-sectional view showing a silicon wafer singulation step according to Embodiment 1.

FIG. 6 is a plan view showing modified region 211 of silicon wafer 201 according to the present embodiment. FIG. 7 is a cross-sectional view showing the step of singulating silicon wafer 201 according to the present embodiment. FIG. 7 shows a VII-VII cross section of FIG. 6. Note that FIG. 7 shows metal film 221 formed on the main surface of silicon wafer 201. Metal film 221 includes first metal film 121 and solder film 116.

As shown in FIG. 6, modified region 211 is formed at a position that becomes a dividing plane in silicon wafer 201. More specifically, modified region 211 including minute cracks is formed at positions corresponding to third surface 103 and fourth surface 104 in substrate 110 of submount 100.

As shown in FIG. 7, modified regions 211 are formed by irradiating processing laser 302 onto silicon wafer 201 from the lower surface of silicon wafer 201 (that is, the surface corresponding to the fifth surface of substrate 110). That is, irradiation positions 303 of processing laser 302 become modified regions 211. Processing laser 302 has only to be a laser having a wavelength that passes through silicon wafer 201 and have sufficient power for forming modified regions 211. Furthermore, the surface roughness (arithmetic average roughness Ra) of the lower surface of silicon wafer 201 in FIG. 7 corresponding to fifth surface 105 is 0.2 μm or less, and silicon which is a material included in substrate 110 is exposed. Thereby, since the scattering in the incident surface to silicon wafer 201 of the processing laser can be suppressed, the dividing quality can be improved further.

After modified regions 211 are formed on silicon wafer 201, tape material 306 attached to silicon wafer 201 is stretched. Here, since cracks are formed in modified regions 211 by processing laser 302, silicon wafer 201 can be divided at each modified regions 211 when tape material 306 is stretched. Thereby, substrate 110 can be formed. As described above, each modified region 211 corresponds to third surface 103 and fourth surface 104 of substrate 110.

Figure 8:
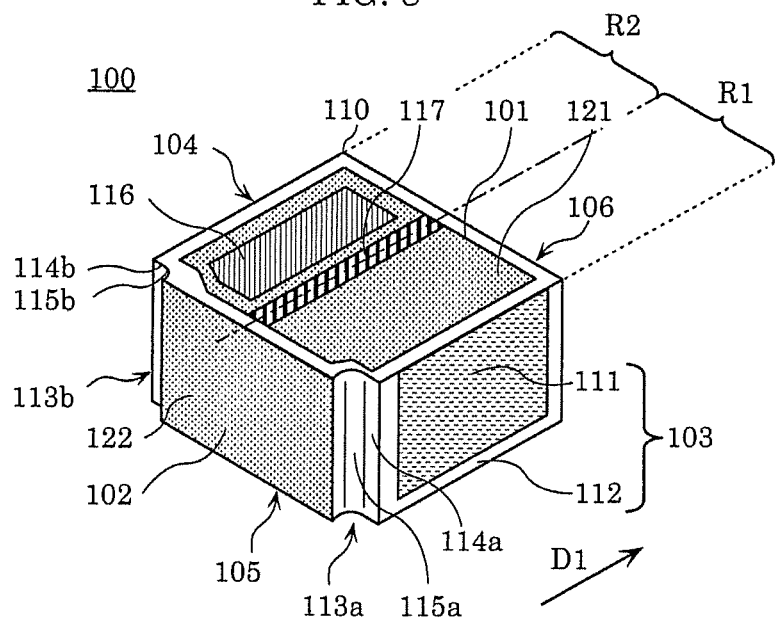
FIG. 8 is a perspective view showing a configuration of the submount according to Embodiment 1.

Submount 100 formed by the above steps will be described with reference to the drawings. FIG. 8 is a perspective view showing a configuration of submount 100 according to the present embodiment.

In third surface 103 of submount 100 shown in FIG. 8, outer edge portions 112 on a first notch part 113a side, a fifth surface 105 side, and a sixth surface 106 side are regions not modified by processing laser 302. On the other hand, in third surface 103, inner region 111 of outer edge portion 112 is a region modified by processing laser 302. Here, the surface roughness of outer edge portions 112 not modified by the processing laser is smaller than the surface roughness of inner region 111. In the present embodiment, the surface roughness (Ra) of inner region 111 is about 1.0 μm or less, and the surface roughness (Ra) of outer edge portion 112 is about 0.2 μm or less. As described above, according to the manufacturing method of submount 100 according to the present embodiment, the surface roughness of third surface 103 and fourth surface 104 corresponding to the dividing surfaces in the singulation can be reduced. Note that although not shown, fourth surface 104 also has outer edge portion 112 and inner region 111 in the same manner as third surface 103.

Furthermore, the surface roughness of third surface 103 and fourth surface 104 divided by stealth dicing as described above is rougher than the surface roughness of second surface 102 formed by etching.

Furthermore, first surface 101 is a {100} plane of Si in the present embodiment. In addition, second surface 102, third surface 103, and fourth surface 104 are each a {100} plane of Si, or are each a {110} plane of Si. Thereby, the dividing direction by stealth dicing can be made to correspond to the crystal orientation of Si which is the material of substrate 110. For this reason, the dividing quality can be further improved.

[1-5. Notch Part of Submount]

Here, the operation and effect of the notch part in the method for manufacturing submount 100 described above will be described with reference to the drawings.

Figure 9:
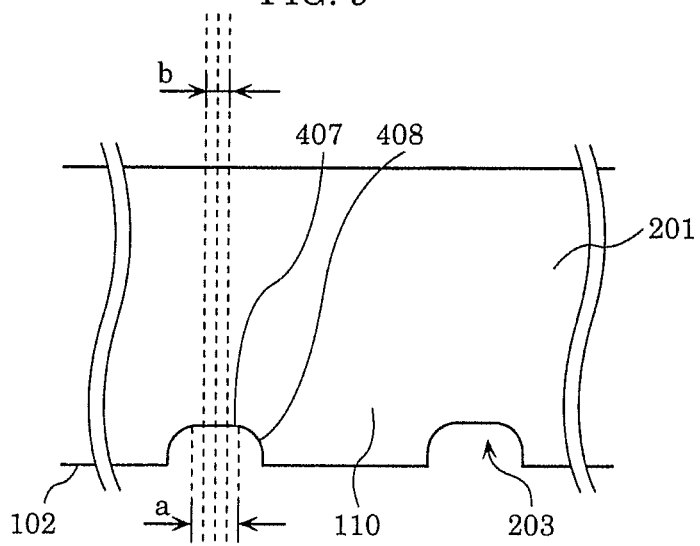
FIG. 9 is a plan view showing a shape of the silicon wafer according to Embodiment 1.

FIG. 9 is a plan view showing the shape of silicon wafer 201 according to the present embodiment. As shown in FIG. 9, notch shape 203 of silicon wafer 201 has parallel surface 407 parallel to the surface to be second surface 102 of substrate 110 and curved surface 408. The horizontal width a of parallel surface 407 in FIG. 9 is larger than the variation width b of the irradiation position of the processing laser. A force applied to silicon wafer 201 when silicon wafer 201 having such notch shape 203 is divided by being irradiated with the processing laser will be described with reference to the drawings.

Figure 10:
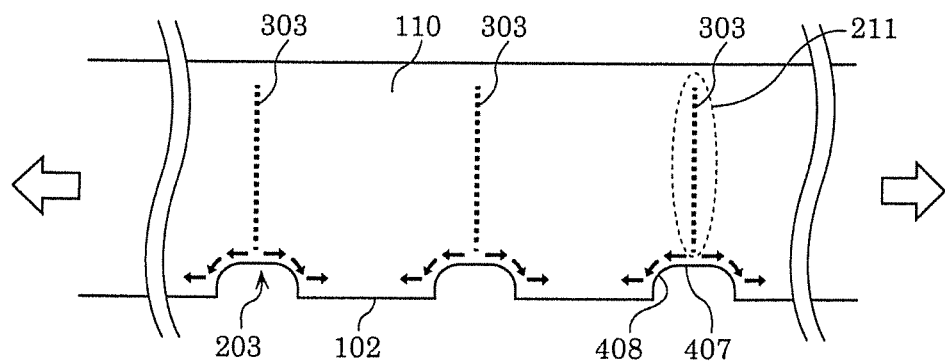
FIG. 10 is a plan view showing a force applied to the silicon wafer when the silicon wafer on which the modified region is formed according to Embodiment 1 is divided.
Figure 11:
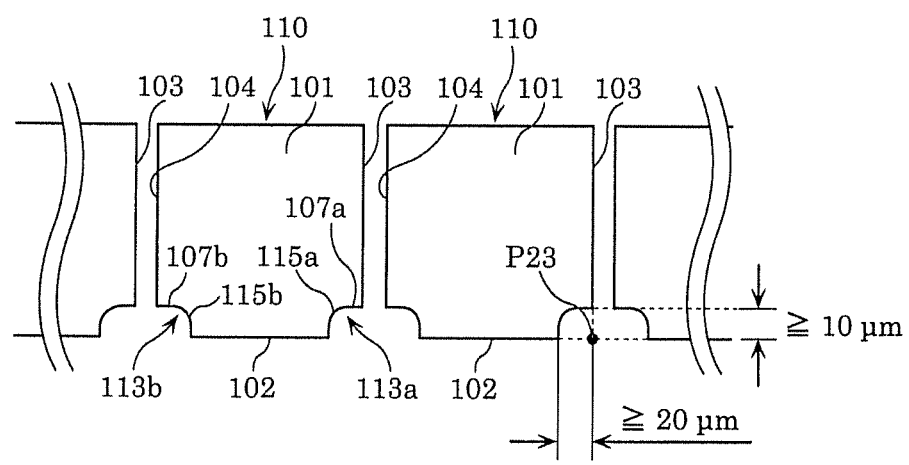
FIG. 11 is a plan view showing a state in which the silicon wafer according to Embodiment 1 is divided into substrates.

FIG. 10 is a plan view showing a force applied to silicon wafer 201 when silicon wafer 201 formed with modified region 211 according to the present embodiment is divided. FIG. 11 is a plan view showing a state in which silicon wafer 201 according to the present embodiment is divided into substrate 110.

As shown in FIG. 10, when silicon wafer 201 formed with modified region 211 corresponding to irradiation position 303 of the processing laser is expanded in the horizontal direction in FIG. 10, a force is applied in the direction indicated by the arrow in proximity to notch shape 203 of silicon wafer 201. Here, since minute cracks are formed in modified region 211, silicon wafer 201 is divided along modified region 211 as shown in FIG. 11. In particular, width a of parallel surface 407 is larger than variation width b of the irradiation position of the processing laser in notch shape 203 as described above in the present embodiment, it is possible to suppress silicon wafer 201 from being divided in curved surface 408 and the like other than parallel surface 407. Furthermore, since parallel surface 407 and curved surface 408 are smoothly connected to each other in notch shape 203, the concentration of the tensile force at a specific position is suppressed. Therefore, silicon wafer 201 can be divided on the surface along modified region 211. That is, it is possible in the present embodiment to realize submount 100 in which the accuracy of the position of the dividing surface and the flatness of the dividing surface are favorable.

In the present embodiment, substrate 110 of submount 100 has first notch part 113a and second notch part 113b corresponding to notch shape 203 of silicon wafer 201. First notch part 113a and second notch part 113b have seventh surfaces 107a and 107b corresponding to parallel surface 407 of silicon wafer 201, respectively. That is, submount 100 has seventh surface 107a substantially parallel to second surface 102 in proximity to third surface 103 in first notch part 113a. Furthermore, submount 100 has seventh surface 107b substantially parallel to second surface 102 in proximity to fourth surface 104 in second notch part 113b.

Since submount 100 has such seventh surfaces 107a and 107b, it is possible to suppress the division at positions other than seventh surfaces 107a and 107b, even if the irradiation position of the processing laser varies when silicon wafer 201 is divided to form submount 100. That is, it is possible to realize submount 100 in which the accuracy of the position of the dividing surface and the flatness of the dividing surface are favorable.

In the present embodiment, the lengths of seventh surfaces 107a and 107b in the horizontal direction in FIG. 11 are about 10 μm. By setting the lengths to 5 μm or more, when silicon wafer 201 is divided, silicon wafer 201 can be more surely prevented from being divided at positions other than seventh surfaces 107a and 107b.

Furthermore, first notch part 113a and second notch part 113b have curved surfaces 115a and 115b corresponding to curved surface 408 of silicon wafer 201, respectively. In the present embodiment, curved surfaces 115a and 115b have an arc shape when seen in a plan view from a first surface 101 side of submount 100. That is, the shape of the cross section of curved surfaces 115a and 115b parallel to first surface 101 is an arc shape. In the present embodiment, the radii of curved surfaces 115a and 115b are about 10 μm. By setting the radii to 5 μm or more, the tension force can be more reliably suppressed from being concentrated at positions corresponding to curved surfaces 115a and 115b when silicon wafer 201 is divided.

Furthermore, in other words, the side on the third surface side is separated by 10 μm or more, and the side on the second surface side is separated by 20 μm or more from intersection P23 of the extension line of third surface 103 with the extension line of second surface 102 when seen in a plan view from the first surface 101 side in first surface 101 as shown in FIG. 11. Thereby, when solder film 116 that is disposed on first surface 101 is melted, the molten solder can be guided to second notch part 113b so that the protrusion of the solder to second surface 102 can be suppressed. This effect will be described in details later.

In addition, the cross section of first notch part 113a and second notch part 113b parallel to first surface 101 is in an almost similar shape from the first surface 101 side to the fifth surface 105 side in the present embodiment.

[1-6. Configuration of Second Surface]

Next, a configuration for improving the surface roughness of second surface 102 of substrate 110 of submount 100 according to the present embodiment will be described.

The inventors have found that the angle formed between first surface 101 and second surface 102 in substrate 110 and the surface roughness of second surface 102 have a correlation. Hereinafter, the correlation will be described.

Figure 12A:
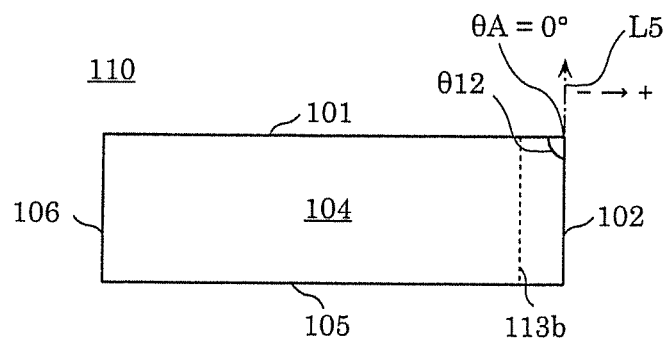
FIG. 12A is a side view schematically showing an outline of the fourth surface of the submount when the angle formed between the first surface and the second surface of the submount according to Embodiment 1 is 90°.
Figure 12B:
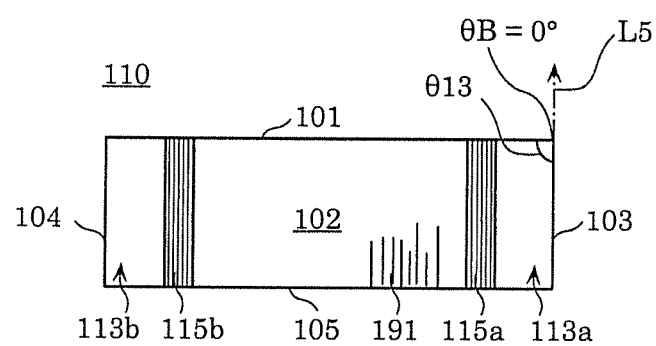
FIG. 12B is a side view schematically showing an outline of the second surface of the submount when the angle formed between the first surface and the second surface of the submount according to Embodiment 1 is 90°.
Figure 13A:
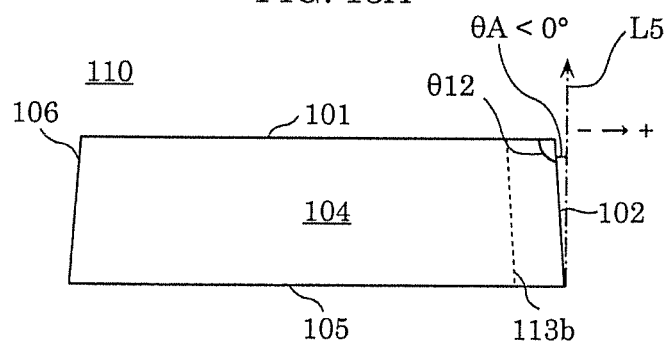
FIG. 13A is a side view schematically showing an outline of the fourth surface of the submount when the angle formed between the first surface and the second surface of the submount according to Embodiment 1 is larger than 90°.
Figure 13B:
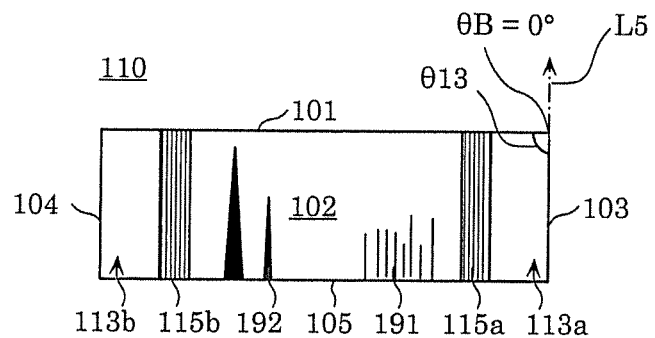
FIG. 13B is a side view schematically showing the outline of the second surface of the submount when the angle formed between the first surface and the second surface of the submount according to Embodiment 1 is larger than 90°.

First, the case where the angle formed between first surface 101 and second surface 102 is 90° or more will be described with reference to the drawings. FIGS. 12A and 12B are side views schematically showing an outline of fourth surface 104 and second surface 102 of submount 100 when angle 612 formed between first surface 101 and second surface 102 of submount 100 according to the present embodiment is 90°, respectively. FIGS. 13A and 13B are side views schematically showing an outline of fourth surface 104 and second surface 102 of submount 100 when angle θ12 formed between first surface 101 and second surface 102 of submount 100 according to the present embodiment is more than 90°, respectively. Note that as shown in each drawing, angle θ13 formed between first surface 101 and third surface 103 is 90° in any examples.

In the example shown in FIGS. 12A and 12B, angle θA formed between normal line L5 of fifth surface 105 of substrate 110 and second surface 102 is 0°, and angle θB formed between normal line L5 and third surface 103 is also 0°. Note that the value of θA may be, for example, negative if the end portion of first surface 101 on the second surface 102 side is in a position closer to sixth surface 106 than normal line L5 passing through the end portion of fifth surface 105 on the second surface 102 side, and positive if it is in a position farther from sixth surface 106. Similarly to θA, the value of θB may be also negative if the end portion of first surface 101 on the third surface 103 side is in a position closer to fourth surface 104 than normal line L5 passing through the end portion of fifth surface 105 on the third surface 103 side, and positive if it is in a position farther from fourth surface 104.

When angle θ12 formed between first surface 101 and second surface 102 is 90° as shown in FIGS. 12A and 12B, that is, when θA is 0°, rough surface 191 is generated on surface 102. Furthermore, when angle θ12 is larger than 90° as shown in FIGS. 13A and 13B, that is, when θA is negative, rough surface 191 and protruding vertical stripes 192 are generated on second surface 102.

Thus, when angle θ12 is 90° or more, the surface roughness of second surface 102 is relatively rough. Here, a problem that occurs when the surface roughness of second surface 102 is rough will be described with reference to the drawings.

Figure 14A:
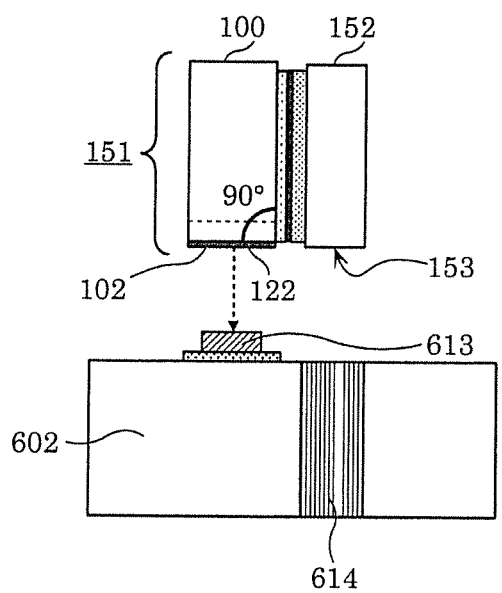
FIG. 14A is a diagram showing a state immediately before a semiconductor laser device including the submount according to Embodiment 1 is mounted on the slider of the heat assisted hard disk device.
Figure 14B:
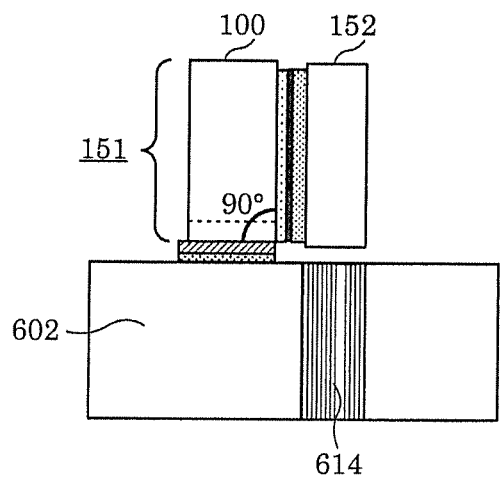
FIG. 14B is a diagram showing a state in which the semiconductor laser device including the submount according to Embodiment 1 is mounted on the slider of the heat assisted hard disk device.

FIG. 14A is a diagram showing a state immediately before mounting semiconductor laser device 151 including submount 100 according to the present embodiment on slider 602 of the heat assisted hard disk device. FIG. 14B is a diagram showing a state in which semiconductor laser device 151 including submount 100 according to the present embodiment is mounted on slider 602 of the heat assisted hard disk device. FIGS. 14A and 14B show an example in which submount 100 having angle θ12 of 90° is used.

As shown in FIGS. 14A and 14B, semiconductor laser device 151 is mounted on slider 602 so that emission surface 153 of semiconductor laser chip 152 faces near-field light generating element 614 provided in slider 602. In this case, second surface 102 of submount 100 is used as a mounting surface to slider 602 on which solder 613 is disposed. Here, as shown in FIG. 12B, since rough surface 191 is generated on second surface 102, the bonding strength between second surface 102 and slider 602 with solder 613 decreases.

As described above, when angle θ12 formed between first surface 101 and second surface 102 is 90° or more, a problem arises when second surface 102 is a mounting surface because the surface roughness of second surface 102 is rough.

Figure 15A:
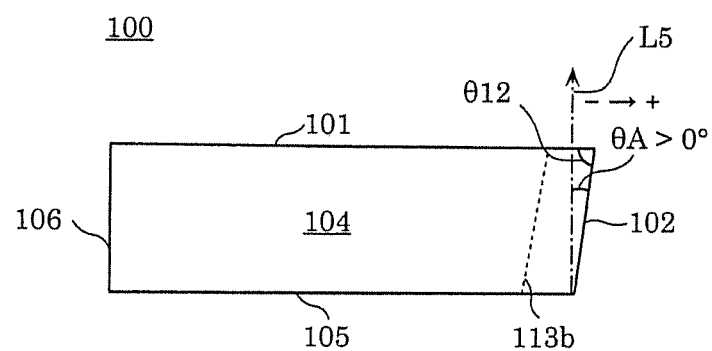
FIG. 15A is a side view schematically showing an outline of the fourth surface of the submount when the angle formed between the first surface and the second surface of the submount according to Embodiment 1 is an acute angle.
Figure 15B:
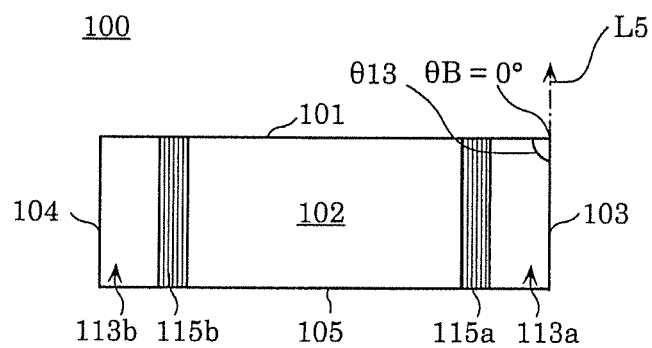
FIG. 15B is a side view schematically showing an outline of the second surface of the submount when the angle formed between the first surface and the second surface of the submount according to Embodiment 1 is an acute angle.

Next, the case where angle θ12 formed between first surface 101 and second surface 102 is less than 90° (that is, an acute angle) will be described with reference to the drawings. FIGS. 15A and 15B are side views schematically showing an outline of fourth surface 104 and second surface 102 of submount 100 when angle θ12 formed between first surface 101 and second surface 102 of submount 100 according to the present embodiment is an acute angle, respectively. Note that angle θ13 formed between first surface 101 and third surface 103 is also 90° in this example. Furthermore, in other words, second surface 102 is inclined with respect to the direction of normal L5 of fifth surface 105, and angle θA is positive. In addition, angle θB formed between normal L5 and third surface 103 is 0°. That is, in this case, the inclination of second surface 102 with respect to the direction of normal L5 of fifth surface 105 is larger than the inclination of third surface 103 with respect to the direction of normal L5 of the fifth surface.

As shown in FIGS. 15A and 15B, when angle θ12 formed between first surface 101 and second surface 102 is an acute angle, the generation of rough surface 191, vertical stripes 192 and the like on second surface 102 is suppressed, and the surface roughness is relatively small. An example in which such second surface 102 is used as a mounting surface will be described with reference to the drawings.

Figure 16:
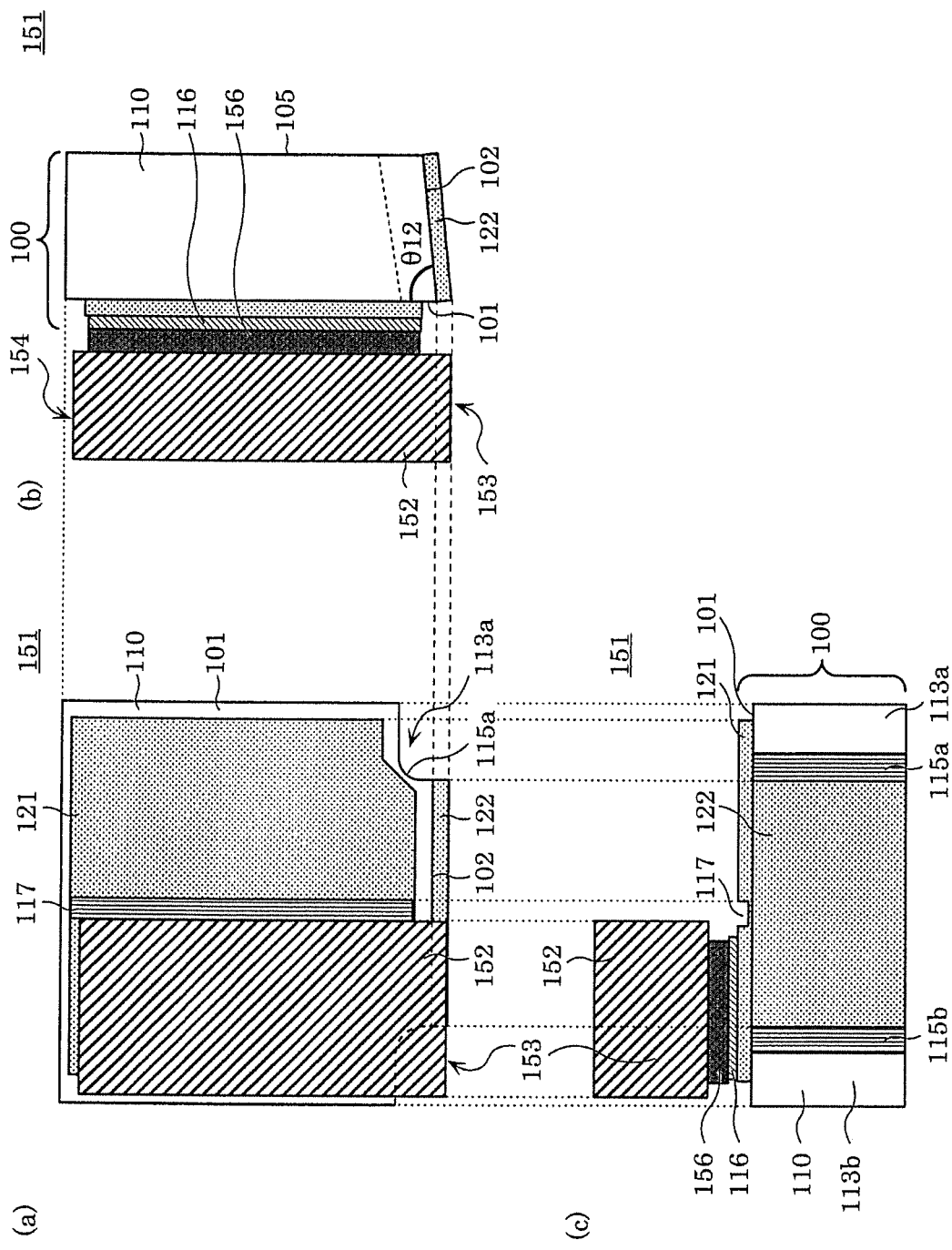
FIG. 16 is a trihedral view showing an outer shape of the semiconductor laser device including the submount according to Embodiment 1.

FIG. 16 is a trihedral view showing the outer shape of semiconductor laser device 151 including submount 100 according to the present embodiment.

As shown in FIG. 16, semiconductor laser device 151 includes submount 100 and semiconductor laser chip 152 mounted on submount 100. Furthermore, emission surface 153 of semiconductor laser chip 152 is disposed on the second surface 102 side of submount 100, and rear end surface 154 facing emission surface 153 is disposed on the sixth surface 106 side. On first surface 101, semiconductor laser chip 152 is mounted at a position closer to fourth surface 104 than third surface 103. In this way, the semiconductor laser chip can be mounted on the end of submount 100 in semiconductor laser device 151.

As shown in the side view (b) of FIG. 16, angle θ12 formed between first surface 101 and second surface 102 of submount 100 is an acute angle. As shown in the plan view (a) and the side view (b) of FIG. 16, second metal film 122 is formed on second surface 102. As shown in the side view (b) and the front view (c) of FIG. 16, electrode 156 of semiconductor laser chip 152 is bonded to first surface 101 of submount 100 via first metal film 121 and solder film 116. Here, the surface of semiconductor laser chip 152 facing first surface 101 is bonded so as to be parallel to first surface 101.

An example in which semiconductor laser device 151 as shown in FIG. 16 is mounted on slider 602 of the heat assisted hard disk device will be described.

Figure 17A:
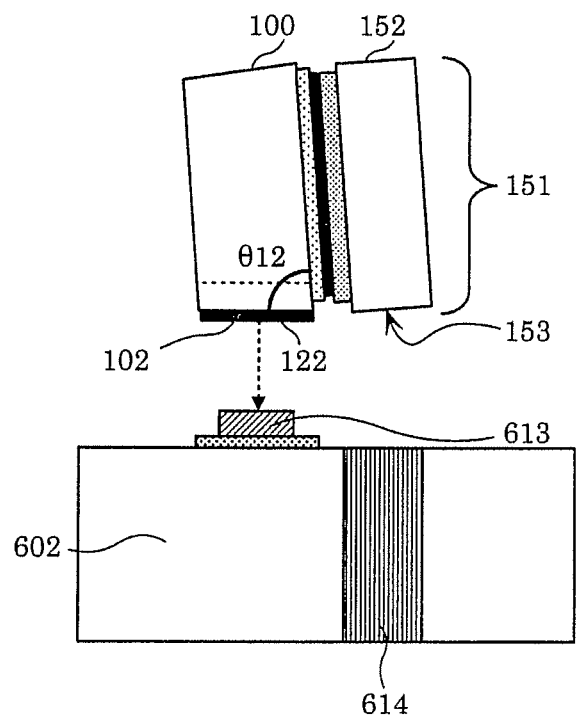
FIG. 17A is a diagram showing a state immediately before the semiconductor laser device shown in FIG. 16 is mounted on the slider of the heat assisted hard disk device.
Figure 17B:
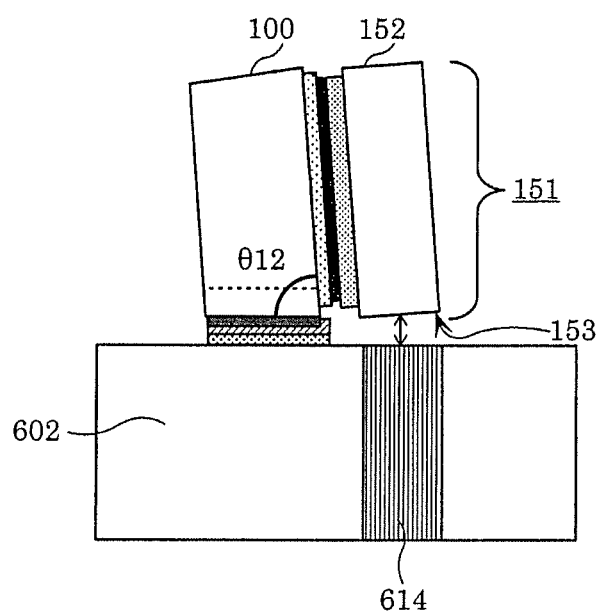
FIG. 17B is a diagram showing a state in which the semiconductor laser device shown in FIG. 16 is mounted on the slider of the heat assisted hard disk device.

FIG. 17A is a diagram showing a state immediately before semiconductor laser device 151 shown in FIG. 16 is mounted on slider 602 of the heat assisted hard disk device. FIG. 17B is a diagram showing a state in which semiconductor laser device 151 shown in FIG. 16 is mounted on slider 602 of the heat assisted hard disk device.

In the example shown in FIGS. 17A and 17B, semiconductor laser device 151 is mounted on slider 602 so that emission surface 153 of semiconductor laser chip 152 faces near-field light generating element 614 provided in slider 602 as in the example shown in FIGS. 14A and 14B. In this case, second surface 102 of submount 100 is used as a mounting surface to slider 602 on which solder 613 is disposed in a state where second metal film 122 is formed. Here, as shown in FIG. 15B, since the surface roughness of second surface 102 is small, the bonding strength between second surface 102 and slider 602 with solder 613 is favorable. In addition, when θ12 is an acute angle as shown in FIG. 17B, emission surface 153 of semiconductor laser chip 152 bonded in parallel to first surface 101 is inclined with respect to slider 602. Therefore, since the distance from slider 602 (or near-field light generating element 614) to emission surface 153 can be increased, emission surface 153 can be prevented from coming into contact with slider 602.

Here, the reason why the surface roughness of second surface 102 is favorable, when angle θ12 formed between first surface 101 and second surface 102 of submount 100 according to the present embodiment is an acute angle, will be described with reference to the drawings.

Figure 18:
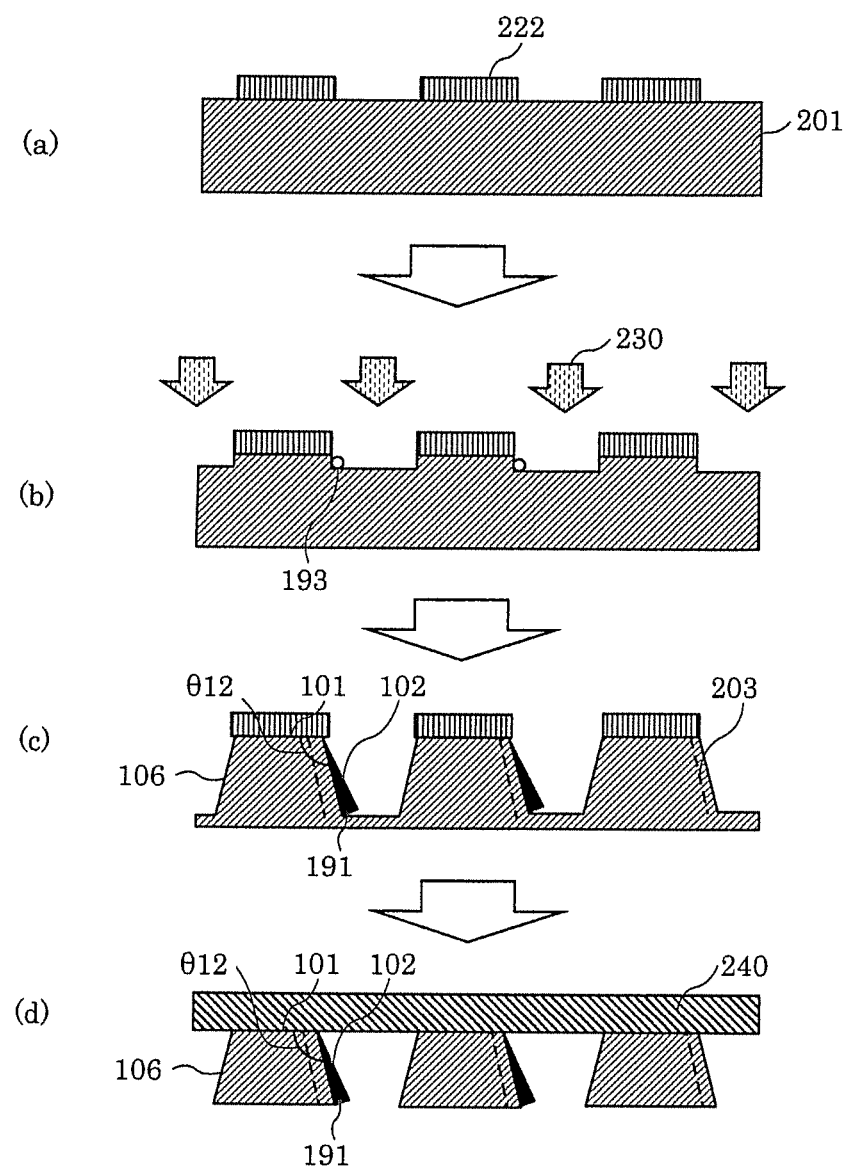
FIG. 18 is a cross-sectional view showing a step of forming the second surface and the sixth surface by etching silicon wafer 201 which is a base material of the submount according to Embodiment 1.

FIG. 18 is a cross-sectional view showing a step of forming second surface 102 and sixth surface 106 by etching silicon wafer 201 which is a base material of submount 100 according to the present embodiment. FIG. 18 shows a state of the cross section in the etching step at a position corresponding to XVIII-XVIII in FIG. 5.

In the example shown in FIG. 18, first, silicon wafer 201 on which resist 222 is formed is prepared as shown in the cross-sectional view (a) of FIG. 18, and silicon wafer 201 is etched by etching gas 230 as shown in the cross-sectional view (b). At this time, foreign object 193 may exist on silicon wafer 201. For example, when angle θ12 formed between first surface 101 and second surface 102 is larger than 90°, foreign object 193 tends to stay on second surface 102 and sixth surface 106. For this reason, rough surface 191, vertical stripes 192 and the like are generated due to foreign object 193. Note that vertical stripe 192 is not shown in FIG. 18. On the other hand, when angle θ12 is an acute angle, even if foreign object 193 exists, foreign object 193 falls downward according to gravity. For this reason, foreign object 193 is unlikely to stay on second surface 102. Therefore, the influence of foreign object 193 on the surface roughness of second surface 102 and the like can be reduced.

The inventors have found through experiments that the surface roughness can be reduced by setting the dry etching conditions so that the average value in the in-plane variation of silicon wafer 201 is in the range of 89.7° or more and smaller than 90° as a numerical example of the acute angle of θ12.

Although the surface roughness can be reduced even if θ12 is smaller than the numerical value described above, the light utilization efficiency of the heat assisted hard disk device is lowered as described later.

[1-7. Means for Suppressing Influence of Inclination of Second Surface]

Next, means for suppressing the influence of the inclination of second surface 102 of submount 100 according to the present embodiment will be described. As described above, when angle θ12 formed between second surface 102 and first surface 101 of submount 100 is an acute angle, the distance between emission surface 153 of semiconductor laser device 151 including submount 100 and slider 602 expands. This suppresses emission surface 153 from coming into contact with slider 602, but on the other hand, the coupling efficiency between the laser emitted from emission surface 153 and near-field light generating element 614 provided in slider 602 decreases. Therefore, the light utilization efficiency of the heat assisted hard disk device is reduced. Therefore, two means will be described as means for suppressing the influence of the inclination of second surface 102.

[1-7-1. First Suppressing Means]

The first suppressing means for the influence of the inclination of second surface 102 will be described. As a first suppressing means, means for canceling the inclination by the film thickness of the second metal film formed on second surface 102 will be described with reference to the drawings.

Figure 19:
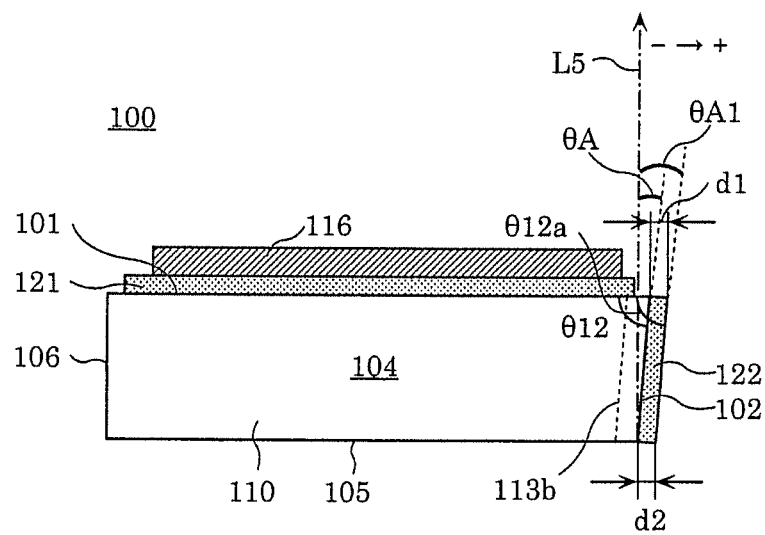
FIG. 19 is a side view showing the shape of the second metal film in the submount that is not subjected to the first suppressing means according to Embodiment 1.
Figure 20:
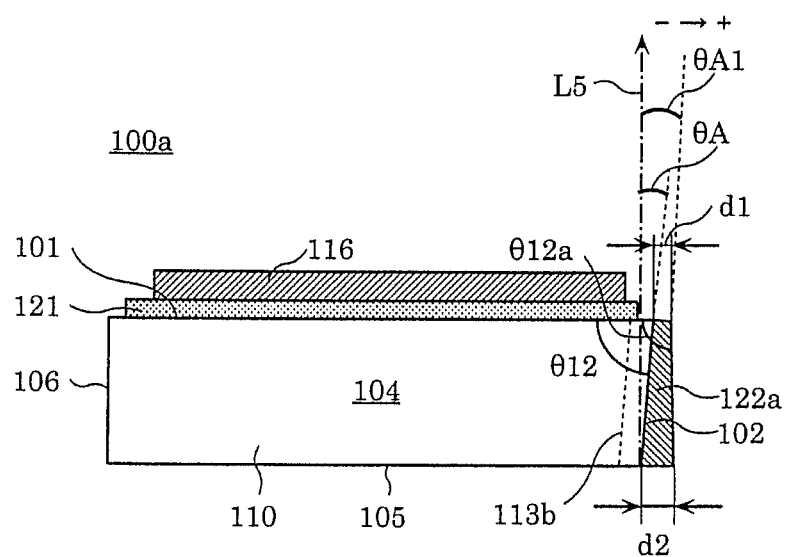
FIG. 20 is a side view showing the shape of the second metal film in the submount that is subjected to the first suppressing means according to Embodiment 1.

FIG. 19 is a side view showing the shape of second metal film 122 in submount 100 that is not subjected to the first suppressing means according to the present embodiment. FIG. 20 is a side view showing the shape of second metal film 122a in submount 100a subjected to the first suppressing means according to the present embodiment.

As shown in FIG. 19, second metal film 122 is formed on second surface 102 with a substantially uniform film thickness in submount 100 that is not subjected to the first suppressing means. For example, film thickness d1 of the end portion on the first surface 101 side of second metal film 122 is substantially equal to film thickness d2 of the end portion of second metal film 122 on the fifth surface 105 side. Therefore, angle θ12 formed between first surface 101 and second surface 102 and angle θ12a formed between first surface 101 and the surface of second metal film 122 are substantially the same. Furthermore, inclination θA of second surface 102 with respect to normal L5 direction of fifth surface 105 is substantially the same as inclination θA1 of the surface of second metal film 122 with respect to normal L5 direction.

On the other hand, submount 100a subjected to the first suppressing means has second metal film 122a that is disposed on second surface 102, and the film thickness of second metal film 122a increases from first surface 101 toward fifth surface 105, as shown in FIG. 20. That is, film thickness d1 of the end portion on the first surface 101 side of second metal film 122a is smaller than film thickness d2 of the end portion on the fifth surface 105 side of second metal film 122a. Therefore, angle θ12a formed between first surface 101 and the surface of second metal film 122a is larger than angle θ12 formed between first surface 101 and second surface 102, and is closer to 90°. Furthermore, inclination θA1 of second metal film 122a relative to normal L5 direction is smaller than inclination θA of second surface 102 relative to normal L5 direction of fifth surface 105.

Figure 21A:
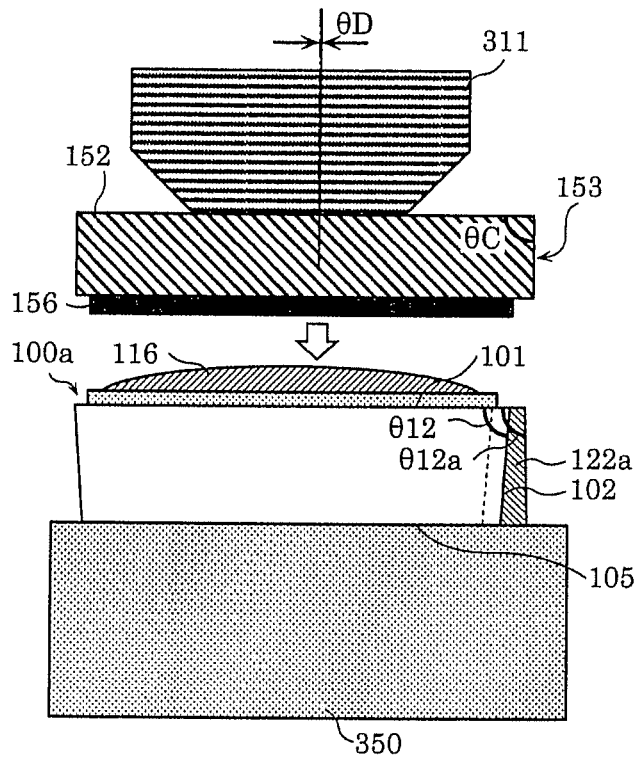
FIG. 21A is a diagram showing a state immediately before the semiconductor laser chip is mounted on the submount according to Embodiment 1.
Figure 21B:
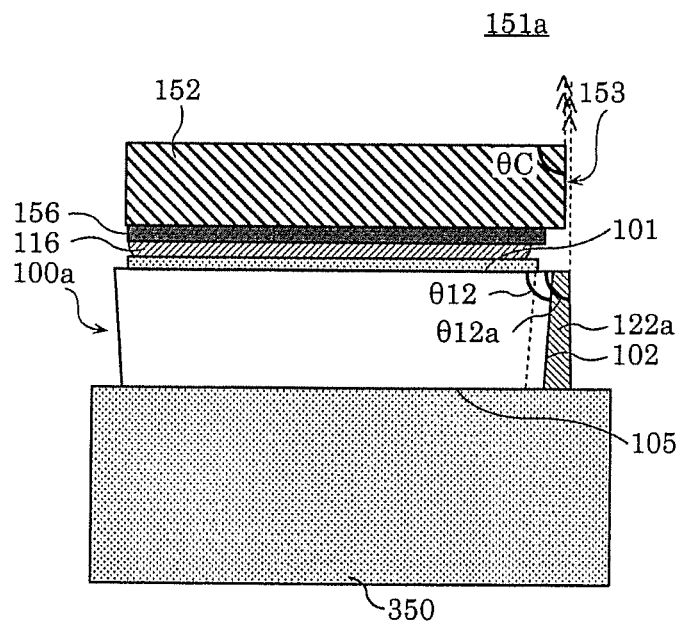
FIG. 21B is a diagram showing a state in which the semiconductor laser chip is mounted on the submount according to Embodiment 1.

A method of mounting semiconductor laser chip 152 on submount 100a shown in FIG. 20 will be described with reference to the drawings. FIG. 21A is a diagram showing a state immediately before semiconductor laser chip 152 is mounted on submount 100a according to the present embodiment. FIG. 21B is a diagram showing a state in which semiconductor laser chip 152 is mounted on submount 100a according to the present embodiment.

As shown in FIG. 21A, submount 100a is disposed on heating stage 350. Fifth surface 105 of submount 100a is in contact with heating stage 350. By performing the heating of heating stage 350, solder film 116 of submount 100a can be melted. On the other hand, semiconductor laser chip 152 is disposed above submount 100a while being held by collet 311. Here, electrode 156 of semiconductor laser chip 152 is held in such an orientation that electrode 156 of semiconductor laser chip 152 faces first surface 101 of submount 100a and emission surface 153 of semiconductor laser chip 152 is substantially parallel to the surface of second metal film 122a. Here, in the present embodiment, θ12a has the average value in the in-plane variation of silicon wafer 201 of about 89.9°, and is in the range from the minimum value of 89.4° or more to the maximum value of 90.4° or less across the in-plane variation. The inclination angle of the collet is, for example, greater than −1° and less than 1°.

Subsequently, collet 311 is used to move semiconductor laser chip 152 onto solder film 116 in the molten state of submount 100 while maintaining the orientation described above. Subsequently, solder film 116 is cooled and solidified by stopping the heating of heating stage 350 in a state in which electrode 156 of semiconductor laser chip 152 is in contact with molten solder film 116. In this way, semiconductor laser device 151a as shown in FIG. 21B can be obtained. The structure of semiconductor laser device 151a shown in FIG. 21B will be described with reference to the drawings.

Figure 22:
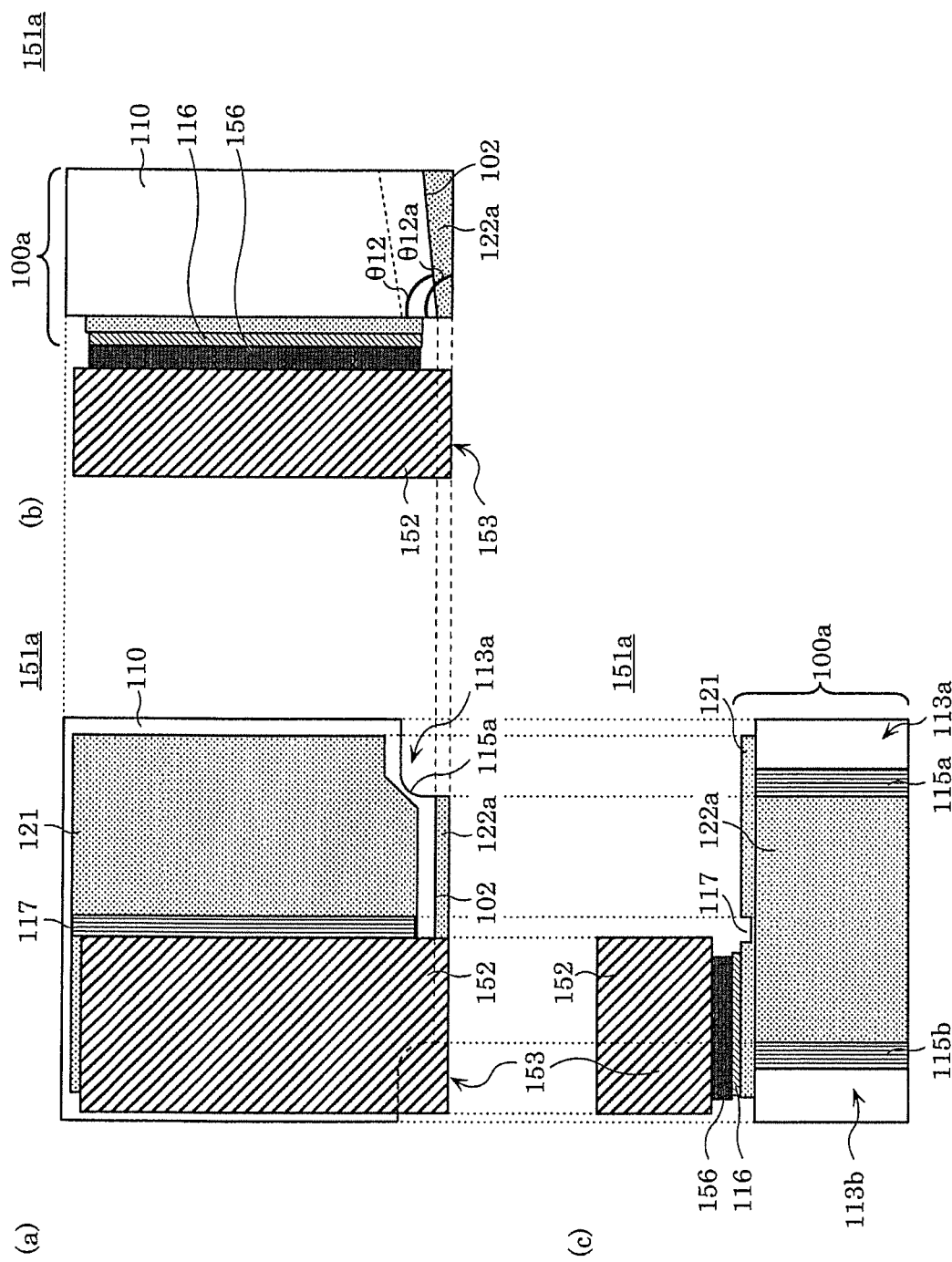
FIG. 22 is a trihedral view showing the structure of the semiconductor laser device according to Embodiment 1.

FIG. 22 is a trihedral view showing the structure of semiconductor laser device 151a according to the present embodiment. As shown in FIG. 22, semiconductor laser device 151a includes submount 100a having solder film 116 that is disposed on first surface 101, and semiconductor laser chip 152 bonded onto first surface 101 of submount 100a via solder film 116. Emission surface 153 of semiconductor laser chip 152 is disposed on the second surface 102 side, and the surface of second metal film 122a and emission surface 153 are substantially parallel to each other. Furthermore, emission surface 153 and the surface of second metal film 122a may be on the same plane.

In addition, since angle θ12a is slightly smaller than 90° in semiconductor laser device 151a, the film thickness of solder film 116 on the second surface 102 side is thinner than the film thickness of the solder film on the sixth surface 106 side.

Figure 23A:
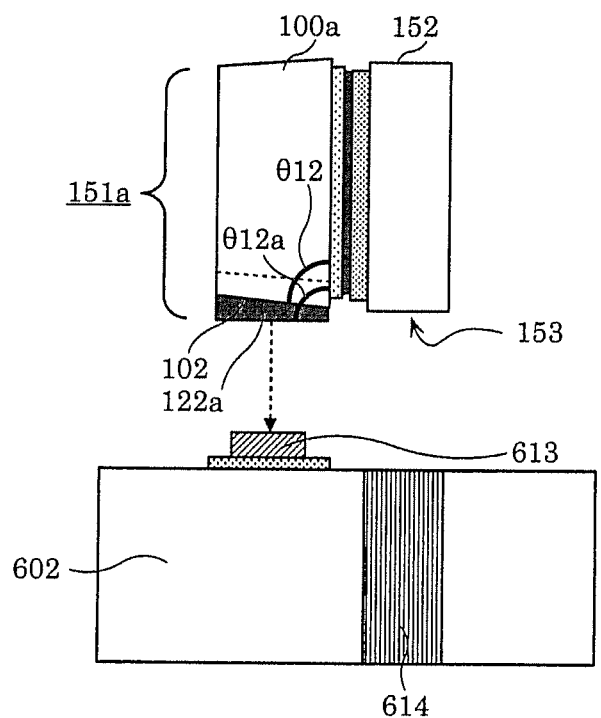
FIG. 23A is a diagram showing a state immediately before the semiconductor laser device according to Embodiment 1 is mounted on the slider of the heat assisted hard disk device.
Figure 23B:
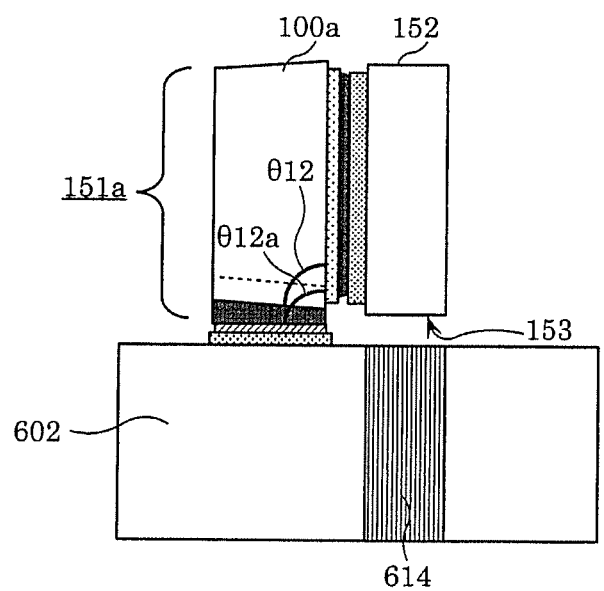
FIG. 23B is a diagram showing a state in which the semiconductor laser device according to Embodiment 1 is mounted on the slider of the heat assisted hard disk device.

An example in which semiconductor laser device 151a shown in FIG. 22 is used in a heat assisted hard disk device will be described with reference to the drawings. FIG. 23A is a diagram showing a state immediately before semiconductor laser device 151a according to the present embodiment is mounted on slider 602 of the heat assisted hard disk device. FIG. 23B is a diagram showing a state in which semiconductor laser device 151a according to the present embodiment is mounted on slider 602 of the heat assisted hard disk device.

In the example shown in FIGS. 23A and 23B, semiconductor laser device 151a is mounted on slider 602 so that emission surface 153 of semiconductor laser chip 152 faces near-field light generating element 614 provided in slider 602 as in the example shown in FIGS. 17A and 17B. In this case, the surface of second metal film 122a of submount 100a is used as a mounting surface to slider 602 on which solder 613 is disposed. Here, as described above, the surface of second metal film 122a is substantially parallel to emission surface 153 of semiconductor laser chip 152. For this reason, the distance between output surface 153 and near-field light generating element 614 can be narrowed relative to the example shown in FIG. 17B. Thereby, the coupling efficiency between the laser emitted from emission surface 153 and near-field light generating element 614 can be increased. Therefore, the light utilization efficiency of the heat assisted hard disk device can be increased. That is, the power consumption of the heat assisted hard disk device can be reduced.

As described above, according to submount 100a, the influence of the inclination of second surface 102 can be suppressed.

Figure 24A:
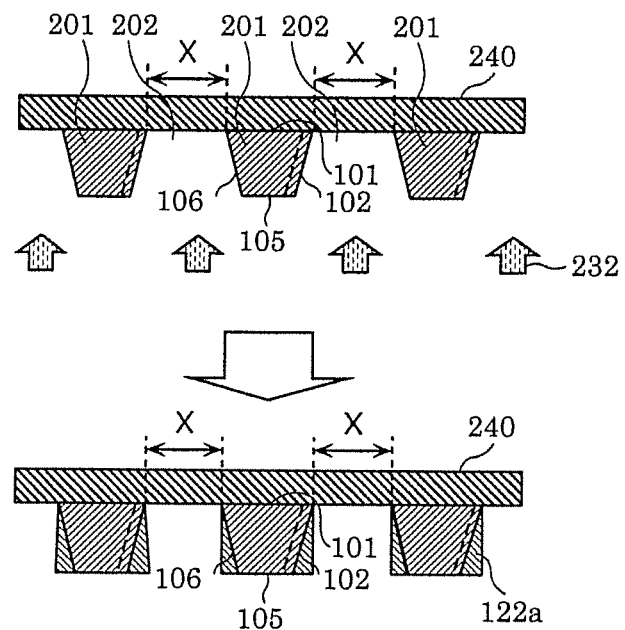
FIG. 24A is a schematic cross-sectional view showing a method for forming the second metal film according to Embodiment 1.
Figure 24B:
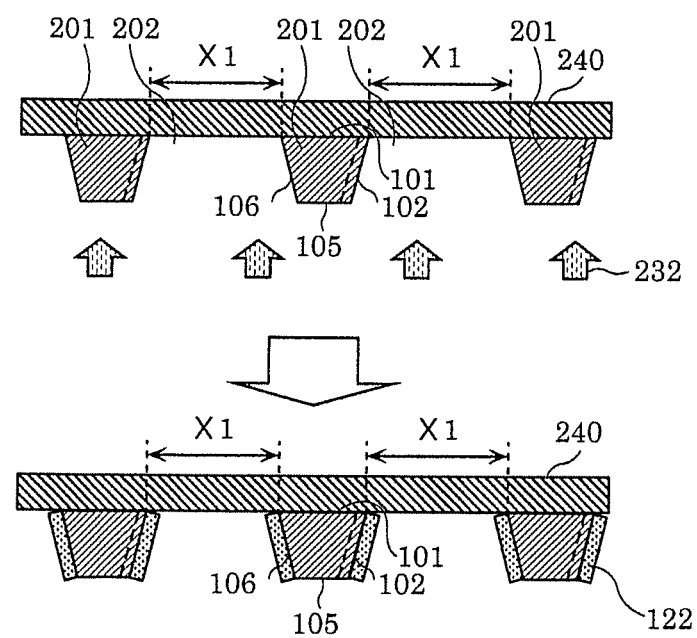
FIG. 24B is a schematic cross-sectional view showing the method for forming the second metal film according to Embodiment 1.

Here, the method for forming second metal film 122a of submount 100a will be described with reference to drawings comparing with the method for forming second metal film 122 of submount 100, for example, from the direction of fifth surface 105. FIGS. 24A and 24B are schematic cross-sectional views showing a method for forming second metal film 122a and second metal film 122 according to the present embodiment, respectively.

Second metal film 122a made of metal material 232 is formed on second surface 102 and sixth surface 106 facing through groove 202 of silicon wafer 201 held by base 240 by sputtering or electron beam evaporation. Here, as shown in FIG. 24A, since it becomes difficult for the metal material to reach the portion close to first surface 101 by reducing width X of through groove 202, the thickness of the metal film at the portion close to first surface 101 becomes smaller. Thereby, second metal film 122a that increases in thickness from first surface 101 toward fifth surface 105 can be formed. Width X of through groove 202 is appropriately set according to the dimensions of submount 100a and the like. For example, when the thickness of submount 100a (the dimension in the direction perpendicular to first surface 101) is about 200 μm, it is only necessary that width X of through groove 202 is about 20 μm or more and 200 μm or less.

On the other hand, when width X1 of through groove 202 is sufficiently increased as shown in FIG. 24B, second metal film 122 having a uniform film thickness is formed.

[1-7-2. Second Suppressing Means]

The second suppressing means for the influence of the inclination of second surface 102 will be described. As a second suppressing means, a means for mounting an element in an orientation corresponding to the inclination of second surface 102 when the element is mounted on the submount will be described with reference to the drawings.

Figure 25A:
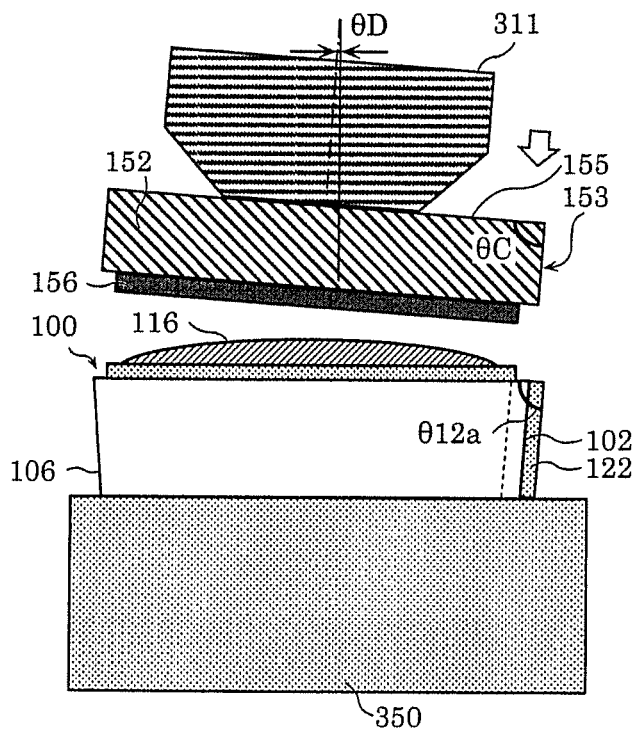
FIG. 25A is a diagram showing a state immediately before the semiconductor laser chip is mounted on the submount according to Embodiment 1.
Figure 25B:
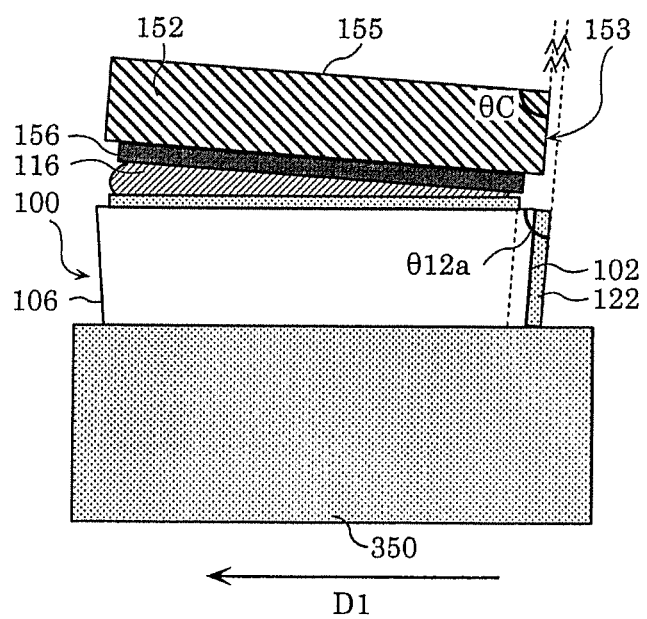
FIG. 25B is a diagram showing a state in which the semiconductor laser chip is mounted on the submount according to Embodiment 1.

FIG. 25A is a diagram showing a state immediately before semiconductor laser chip 152 is mounted on submount 100 according to the present embodiment. FIG. 25B is a diagram showing a state in which semiconductor laser chip 152 is mounted on submount 100 according to the present embodiment.

As shown in FIGS. 25A and 25B, the present suppressing means uses submount 100 having inclined second surface 102 on which second metal film 122 having a uniform film thickness is formed.

As shown in FIG. 25A, submount 100 is disposed on heating stage 350. Fifth surface 105 of submount 100 is in contact with heating stage 350. By performing the heating of heating stage 350, solder film 116 of submount 100 can be melted. On the other hand, semiconductor laser chip 152 is disposed above submount 100 while being held by collet 311. Here, electrode 156 of semiconductor laser chip 152 is held in such an orientation that electrode 156 of semiconductor laser chip 152 faces first surface 101 of submount 100a and emission surface 153 of semiconductor laser chip 152 is substantially parallel to the surface of second metal film 122a. That is, semiconductor laser chip 152 is held in an inclined orientation as shown in FIG. 25A. Here, inclination angle θD of semiconductor laser chip 152, that is, inclination angle θD of collet 311 can be obtained from angle θ12a formed between first surface 101 of submount 100 and the surface of second metal film 122, and angle θC formed between upper surface 155 of semiconductor laser chip 152 (the surface on the back side of the surface on which electrode 156 is formed) and emission surface 153.

Subsequently, collet 311 is used to move semiconductor laser chip 152 onto solder film 116 in the molten state of submount 100 while maintaining the orientation described above. Subsequently, solder film 116 is cooled and solidified by stopping the heating of heating stage 350 in a state in which electrode 156 of semiconductor laser chip 152 is in contact with molten solder film 116. In this way, semiconductor laser device 151a in which the surface of second metal film 122 and emission surface 153 of semiconductor laser chip 152 are substantially parallel as shown in FIG. 25B can be obtained.

As described above, semiconductor laser device 151b shown in FIG. 25B includes submount 100 having solder film 116 that is disposed on first surface 101, and semiconductor laser chip 152 bonded on first surface 101 of submount 100 via solder film 116. And emission surface 153 of semiconductor laser chip 152 is disposed on the second surface 102 side, and second surface 102 and emission surface 153 are substantially parallel.

According to such a semiconductor laser device 151b, when second surface 102 on which second metal film 122 is formed is used as a mounting surface, the mounting surface and emission surface 153 can be made substantially parallel, so that the influence of the inclination of second surface 102 can be suppressed.

In addition, the film thickness of solder film 116 changes with respect to first direction D1 in semiconductor laser device 151b as shown in FIG. 25B. More specifically, the thickness of solder film 116 is small near second surface 102 of submount 100, and the thickness of solder film 116 is large near sixth surface 106 in semiconductor laser device 151 b. For this reason, for example, the excess solder may flow out to second surface 102 and the like of submount 100 in proximity to second surface 102. Therefore, a configuration of a solder film for solving such a problem will be described with reference to the drawings.

Figure 26A:
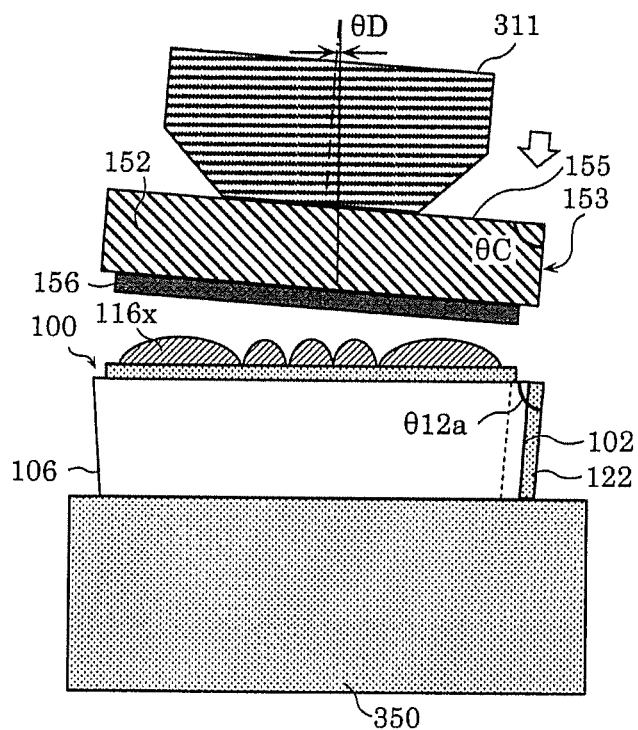
FIG. 26A is a diagram showing a state immediately before the semiconductor laser chip is mounted on the submount according to Embodiment 1.
Figure 26B:
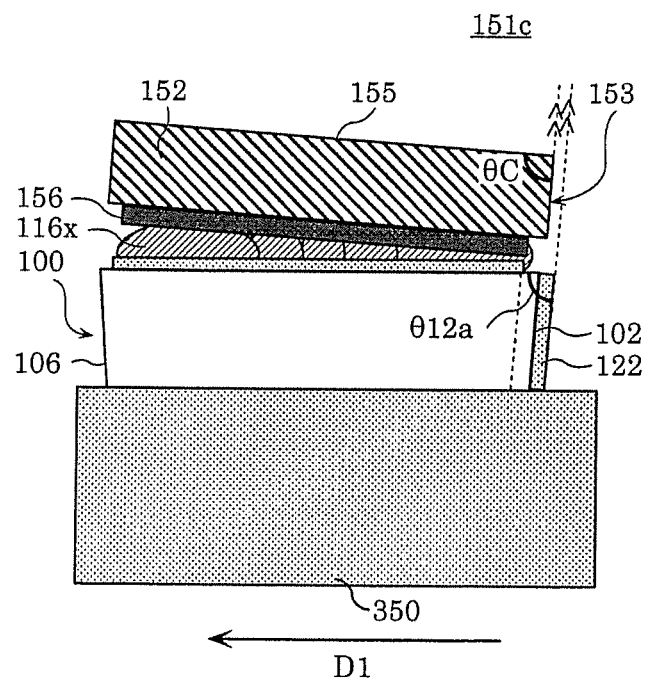
FIG. 26B is a diagram showing a state in which the semiconductor laser chip is mounted on the submount according to Embodiment 1.

FIG. 26A is a diagram showing a state immediately before semiconductor laser chip 152 is mounted on submount 100 according to the present embodiment. FIG. 26B is a diagram showing a state in which semiconductor laser chip 152 is mounted on submount 100 according to the present embodiment.

Submount 100 shown in FIG. 26A differs from submount 100 shown in FIG. 25A in the configuration of solder film 116x. In the example shown in FIG. 26A, submount 100 has solder film 116x formed in a strip shape. Thereby, the amount of solder film 116x can be freely changed according to the position. Therefore, the amount of solder film 116x can be reduced at a position close to second surface 102 of submount 100, and the amount of solder film 116x can be increased at a position close to sixth surface 106. By mounting semiconductor laser chip 152 on submount 100 via such solder film 116x, semiconductor laser device having a small thickness of solder film 116 in proximity to second surface 102 and a large thickness of solder film 116 in proximity to sixth surface 106 of submount 100 as shown in FIG. 26B can be obtained.

As described above, semiconductor laser device 151c in which the surface of second metal film 122 and emission surface 153 of semiconductor laser chip 152 are substantially parallel can be obtained. Furthermore, when semiconductor laser chip 152 is mounted, it is possible to suppress the solder from flowing out to second surface 102 and the like of submount 100.

Figure 27A:
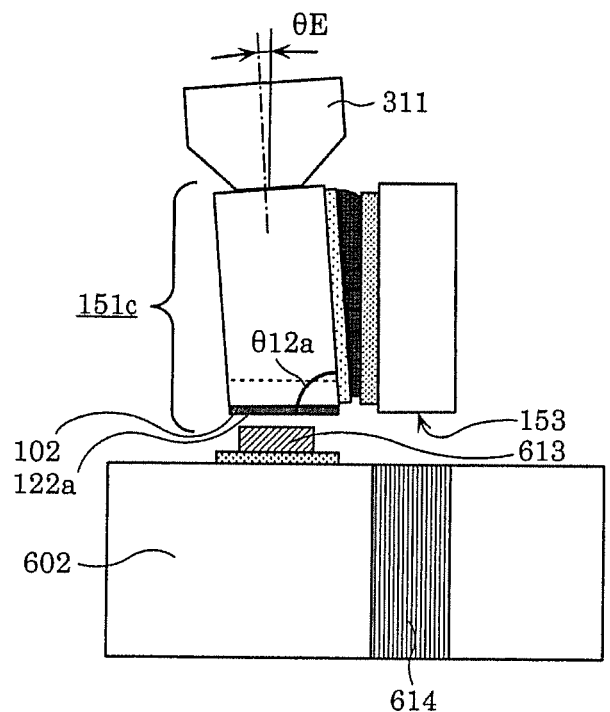
FIG. 27A is a diagram showing a state immediately before the semiconductor laser device according to Embodiment 1 is mounted on the slider of the heat assisted hard disk device.
Figure 27B:
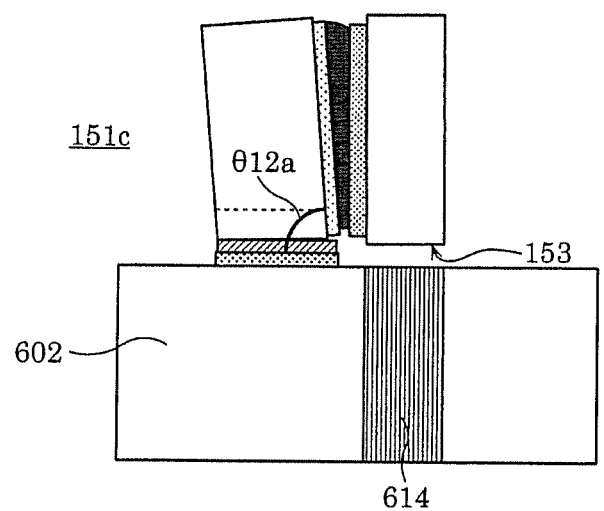
FIG. 27B is a diagram showing a state in which the semiconductor laser device according to Embodiment 1 is mounted on the slider of the heat assisted hard disk device.

Subsequently, the suppression of the influence of the inclination of second surface 102 by the semiconductor laser device to which the second suppressing means is applied will be described with reference to the drawings. FIG. 27A is a diagram showing a state immediately before semiconductor laser device 151c according to the present embodiment is mounted on slider 602 of the heat assisted hard disk device. FIG. 27B is a diagram showing a state in which semiconductor laser device 151c according to the present embodiment is mounted on slider 602 of the heat assisted hard disk device.

As shown in FIG. 27A, semiconductor laser device 151c is mounted on slider 602 so that emission surface 153 of semiconductor laser chip 152 faces near-field light generating element 614 included in slider 602. In this case, second surface 102 of submount 100 is used as a mounting surface to slider 602 on which solder 613 is disposed in a state in which second metal film 122 is formed. Here, semiconductor laser device 151c is held by collet 311 so that the surface of second metal film 122 is parallel to the surface of slider 602. Inclination angle θE of collet 311 can be obtained from angle θ12a formed between first surface 101 of submount 100 and the surface of second metal film 122.

Thereby, semiconductor laser device 151c can be mounted on slider 602 as shown in FIG. 27A. Since the surface of second metal film 122 formed on second surface 102 and emission surface 13 are substantially parallel in semiconductor laser device 151c, the distance between emission surface 153 and near-field light generating element 614 can be reduced. Thereby, the coupling efficiency between the laser emitted from emission surface 153 and near-field light generating element 614 can be increased. Therefore, the light utilization efficiency of the heat assisted hard disk device can be increased. That is, the power consumption of the heat assisted hard disk device can be reduced.

As described above, the influence of the inclination of second surface 102 can be suppressed according to the present suppressing means.

[1-8. Effect of Notch Structure of Submount]

Next, the effect of the notch structure of the submount according to the present embodiment will be described. The notch structure of the submount according to the present embodiment has not only the effect in manufacturing the submount described above but also the effect in use. Hereinafter, a case in which a semiconductor laser chip is mounted on a submount according to the present embodiment will be described with reference to the drawings while comparing with comparative examples.

Figure 28:
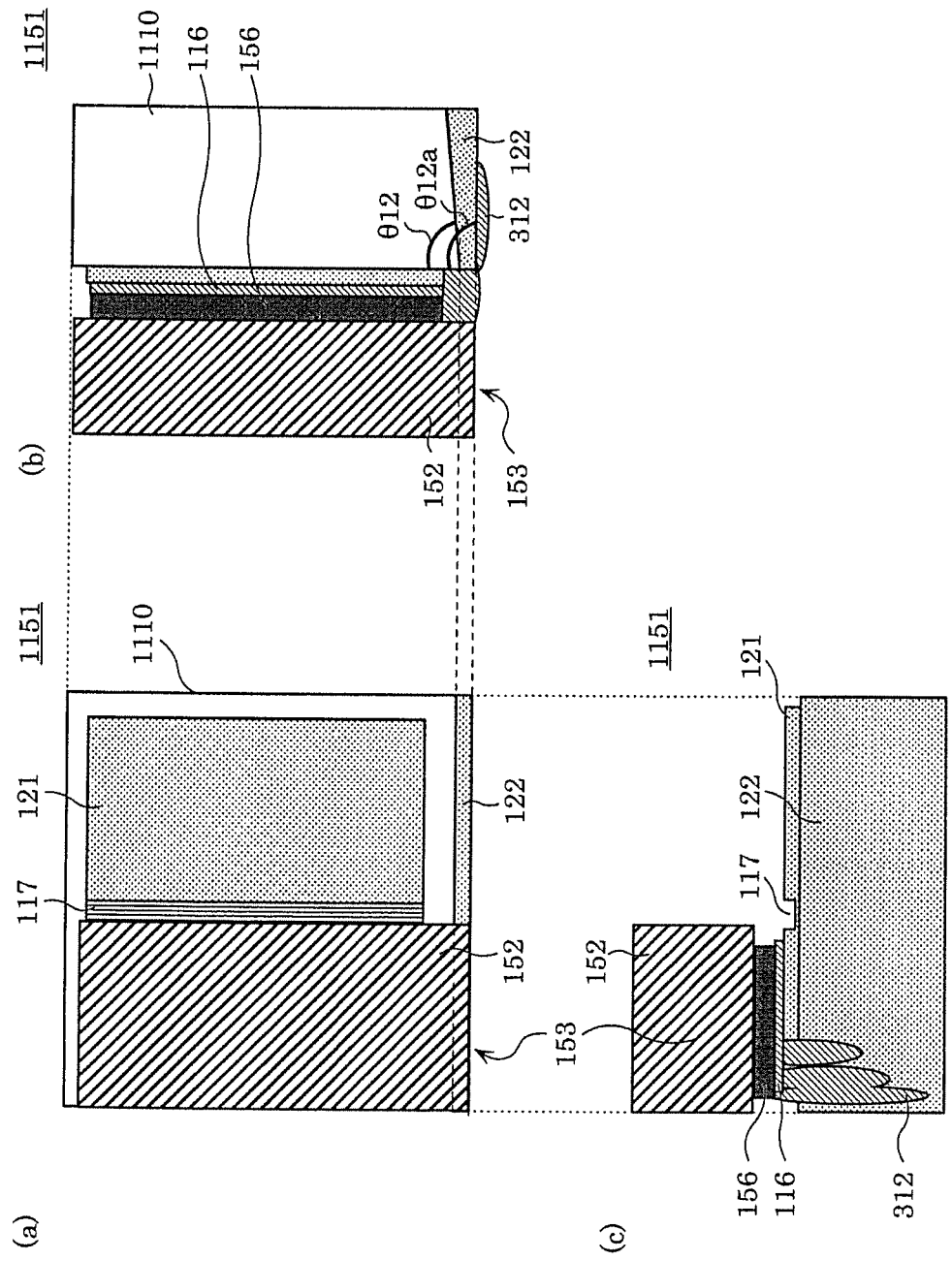
FIG. 28 is a trihedral view showing the structure of the semiconductor laser device of a comparative example.
Figure 29:
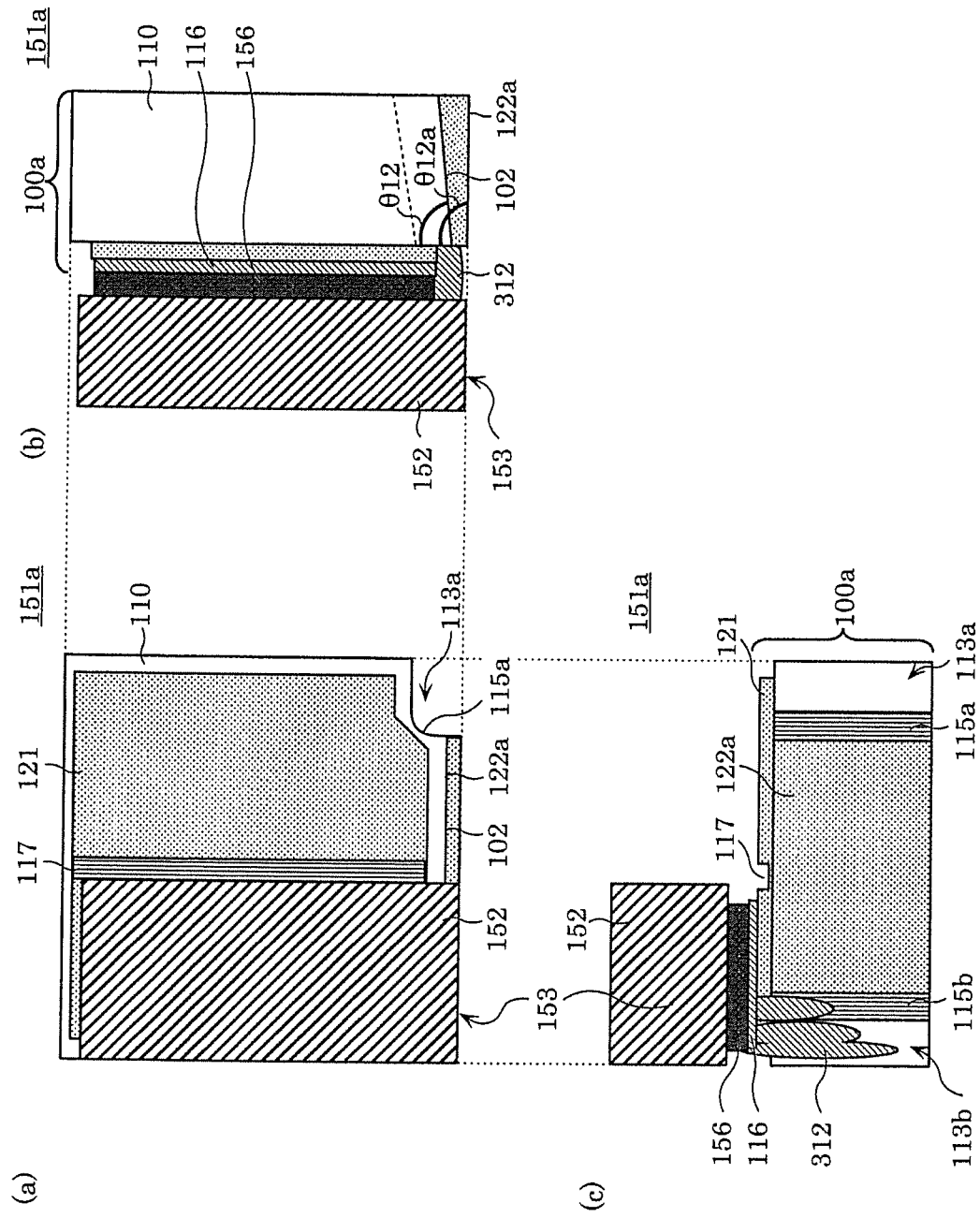
FIG. 29 is a trihedral view showing the structure of the semiconductor laser device according to Embodiment 1.

FIG. 28 is a trihedral view showing the structure of semiconductor laser device 1151 of a comparative example. FIG. 28 shows a plan view (a), a side view (b), and a front view (c) of semiconductor laser device 1151 of the comparative example. FIG. 29 is a trihedral view showing the structure of semiconductor laser device 151a according to the present embodiment. FIG. 29 shows a plan view (a), a side view (b), and a front view (c) of semiconductor laser device 151a according to the present embodiment. Note that FIGS. 28 and 29 show a state in which solder 312 flows out from solder film 116.

Semiconductor laser device 1151 of the comparative example shown in FIG. 28 is different from semiconductor laser device 151a according to the present embodiment in that the notch structure is not formed in substrate 1110, and is identical in other points.

Since no notch structure is formed in substrate 1110 in semiconductor laser device 1151 of the comparative example as shown in FIG. 28, solder 312 may flow out onto second metal film 122. As described above, second metal film 122 is a surface serving as a mounting surface for slider 602 and the like of semiconductor laser device 1151. Therefore, solder 312 may adversely affect the mounting of semiconductor laser device 1151.

On the other hand, semiconductor laser device 151a according to the present embodiment includes submount 100a, and semiconductor laser chip 152 bonded onto first surface 101 of submount 100a via first metal film 121 and solder film 116. Semiconductor laser chip 152 is disposed such that emission surface 153 is on the second surface 102 side. Furthermore, semiconductor laser chip 152 is disposed across at least one of first notch part 113a and second notch part 113b when seen in a plan view from the first surface 101 side. In the present embodiment, semiconductor laser chip 152 is disposed across second notch part 113b when seen in a plan view from the first surface 101 side as shown in the plan view (a) of FIG. 29.

As a result, molten solder 312 flows out mainly to second notch part 113b and hardly flows out onto second metal film 122a as shown in the front view (c) of FIG. 29. Molten solder 312 spreads up to curved surface 115b in second notch part 113b, but does not come in contact with second metal film 122a. That is, the solder film formed by solder 312 is disposed in second notch part 113b and is not disposed on second metal film 122a in semiconductor laser device 151a according to the present embodiment. Therefore, the adverse effect of solder 312 on the mounting of semiconductor laser device 151a can be suppressed. That is, the deterioration of the quality of second surface 102 of submount 100a can be suppressed.

Note that since semiconductor laser chip 152 and solder film 116 are disposed on the second notch part 113b side in the example shown in FIG. 29, solder 312 flows out to second notch 113b, but the configuration of the semiconductor laser device according to the embodiment is not limited thereto. When semiconductor laser chip 152 and solder film 116 are disposed on the first notch 113a side, solder 312 may flow out to first notch part 113a. That is, the solder film formed by solder 312 is disposed in at least one of first notch part 113a and second notch part 113b in the semiconductor laser device according to the present embodiment.

[1-9. Heat Assisted Hard Disk Device]

Next, the heat assisted hard disk device according to the present embodiment will be described. A heat assisted hard disk device according to the present embodiment includes the semiconductor laser device described above and slider 602 on which the semiconductor laser device is mounted. Hereinafter, such a heat assisted hard disk drive will be briefly described with reference to the drawings.

Figure 30:
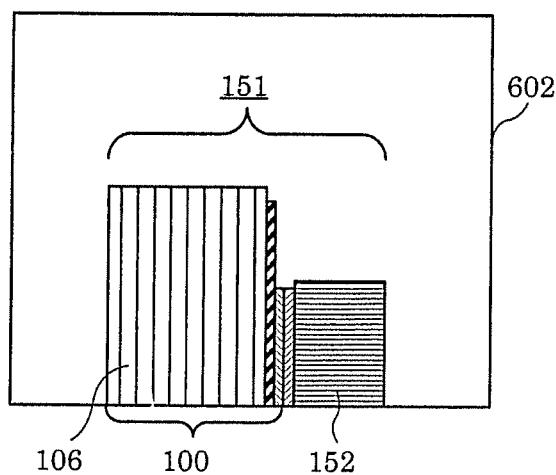
FIG. 30 is a plan view of a slider on which the semiconductor laser device according to Embodiment 1 is mounted.

FIG. 30 is a plan view of slider 602 on which semiconductor laser device 151 according to the present embodiment is mounted.

As shown in FIG. 30, each semiconductor laser device is disposed at the end portion of slider 602. In addition, although not shown in FIG. 30, emission surface 153 of each semiconductor laser device is disposed to face the mounting surface of slider 602. Furthermore, second surface 102 of the submount included in each semiconductor laser device serves as the mounting surface for slider 602. For this reason, since it can be mounted on second surface 102 with small surface roughness, the bonding strength between each semiconductor laser device and slider 602 can be increased.

Embodiment 2

Next, the submount according to Embodiment 2 will be described. The submount according to the present embodiment is different from submount 100 according to Embodiment 1 and the like in the configuration of the solder film. In the submount in which solder film 116 is uniformly provided, such as submount 100 described above, when the element is bonded to molten solder film 116, the solder may be flowed out to the outside of the bonding region between submount 100 and the element, particularly when the amount of solder increases, it may be flowed out to second surface 102. On the other hand, when the film thickness or width of the solder film is reduced in order to suppress the flow-out of the solder, the bonding strength is reduced. Therefore, in this embodiment, a submount having a solder film in which solder hardly flows out and has high bonding strength will be described with reference to the drawings.

Figure 31:
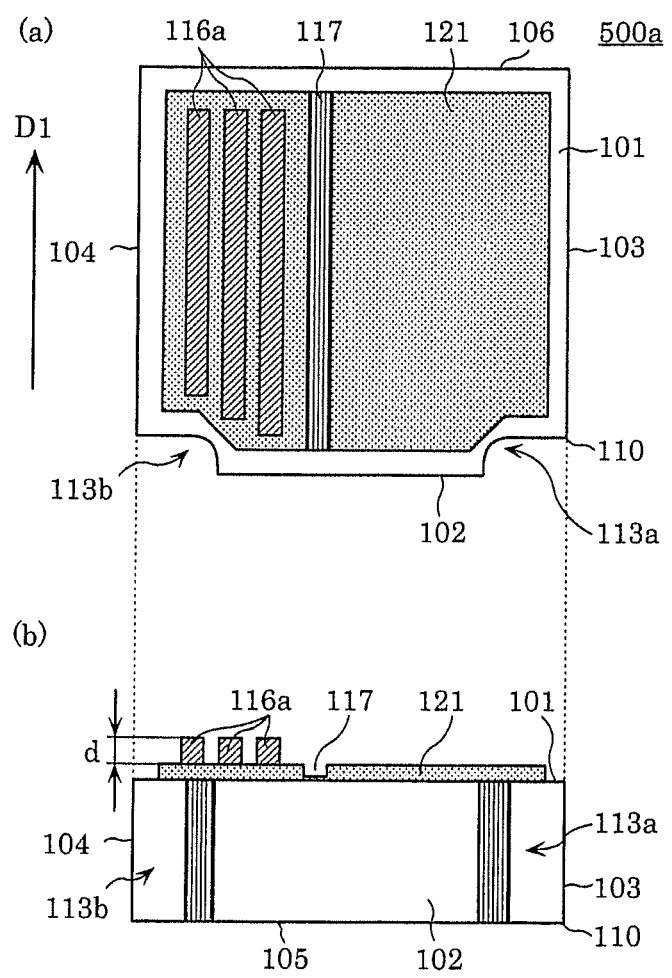
FIG. 31 is a diagram showing the shape of the solder film of the submount according to Embodiment 2.
Figure 32:
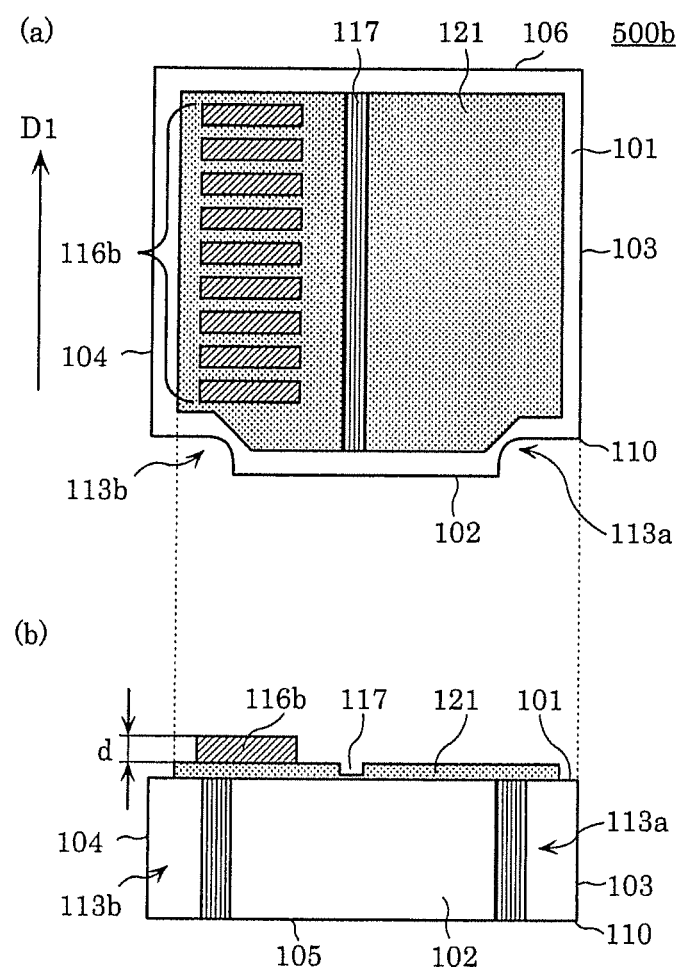
FIG. 32 is a diagram showing the shape of the solder film of the submount according to Variation 1 of Embodiment 2.
Figure 33:
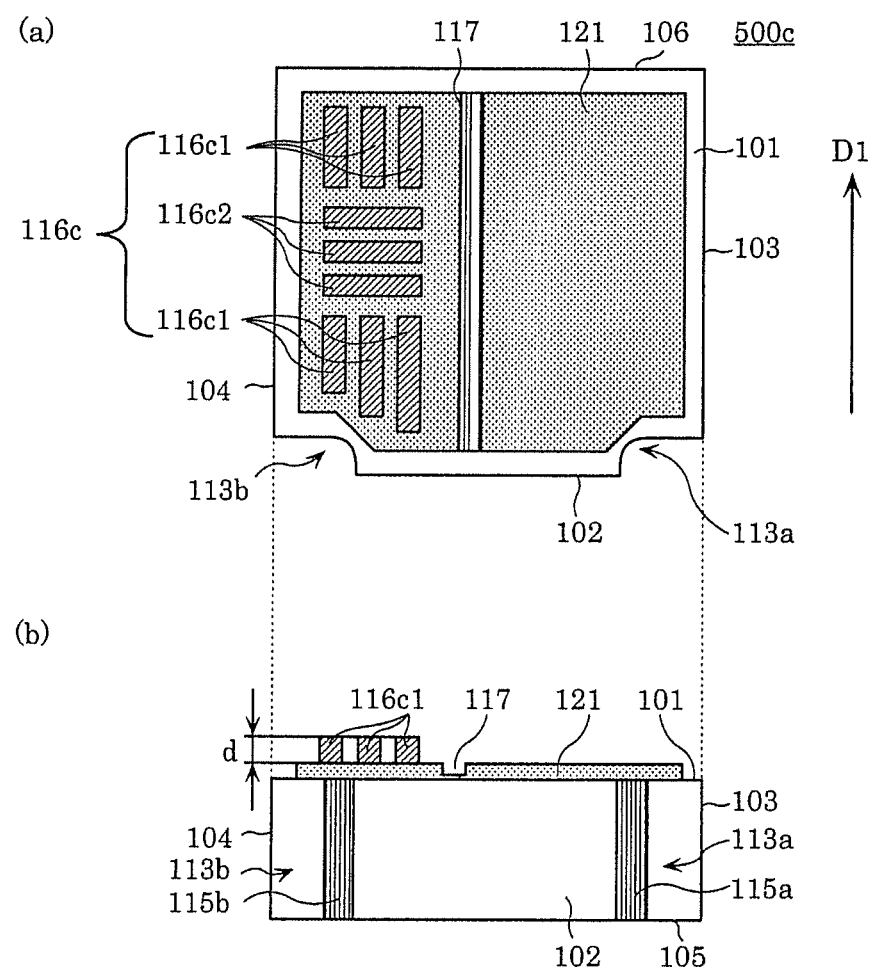
FIG. 33 is a diagram showing the shape of the solder film of the submount according to Variation 2 of Embodiment 2.

FIG. 31 is a diagram showing the shape of solder film 116a of submount 500a according to the present embodiment. FIG. 32 is a diagram showing the shape of solder film 116b of submount 500b according to Variation 1 of the present embodiment. FIG. 33 is a diagram showing the shape of solder film 116c of submount 500c according to Variation 2 of the present embodiment. In FIGS. 31 to 33, a plan view (a) and a front view (b) are shown.

Submount 500a according to the present embodiment is different from submount 100 according to Embodiment 1 in the configuration of solder film 116a, and is identical in other configurations. Submount 500a has patterned solder film 116a. More specifically, solder film 116a has a plurality of strip-shaped portions that is disposed in parallel in submount 500a as shown in the plan view (a) of FIG. 31. Therefore, according to solder film 116a, since the amount of solder can be reduced as compared with solder film 116 according to Embodiment 1, the flow-out of solder can be suppressed. On the other hand, film thickness d of solder film 116a shown in the front view (b) of FIG. 31 can be set equal to that of solder film 116 according to Embodiment 1. Furthermore, by arranging the plurality of strip-shaped portions in parallel in the width direction, it is possible to suppress a decrease in bonding strength due to the small width of each of the plurality of strip-shaped portions.

The method for forming patterned solder film 116a is not particularly limited, but can be formed by using, for example, a lift-off method. That is, a patterned resist film is formed on the surface on which solder film 116a is formed, and the solder film is uniformly formed on the surface on which the resist film is formed, and then solder formed on the resist film may be removed together with the resist film.

Furthermore, since the plurality of strip-shaped portions are separated from each other in solder film 116a, the flow-out of solder can be suppressed as compared with the case in which the plurality of strip-shaped portions are connected. For a plurality of strip-shaped portions that is disposed in parallel, it is only necessary that the width and interval of the strip-shaped portions are set as appropriate according to the size of the bonding region between the submount and the element. Furthermore, the plurality of strip-shaped portions may be at least three or more strip-shaped patterns disposed in parallel. The positions of the end portions of the plurality of strip-shaped portions on the second surface 102 side may be farther from second surface 102 as they are disposed closer to fourth surface 104 along the shape of second notch part 113b.

Furthermore, in solder film 116a according to the present embodiment, the plurality of strip-shaped portions extend in the direction parallel to first direction D1 as shown in FIG. 31. In this case, the direction in which the solder contained in solder film 116a flows when solder film 116a is melted is mainly a direction perpendicular to first direction D1. For this reason, it is possible for solder to flow into second surface 102 serving as the mounting surface of submount 500a.

Note that the plurality of strip-shaped portions of the solder film may not necessarily extend in a direction parallel to first direction D1. For example, like solder film 116b of submount 500b according to Variation 1 shown in FIG. 32, the plurality of strip-shaped portions may extend in a direction that intersects first direction D1. In solder film 116b, the plurality of strip-shaped portions extends in the direction perpendicular to first direction D1.

Furthermore, the plurality of strip-shaped portions of the solder film may not necessarily extend in only one direction, and may extend in a plurality of directions. For example, like solder film 116c of submount 500c according to Variation 2 shown in FIG. 33, solder film 116c may include solder film 116c1 having a first strip-shaped portion extending in a direction parallel to first direction D1, and solder film 116c2 having a second strip-shaped portion extending in a direction that intersects first direction D1. Note that the second strip-shaped portion that solder film 116c2 according to Variation 2 has extends in the direction perpendicular to first direction D1.

In addition, at least a part of the first strip-shaped portion is disposed closer to second surface 102 than the second strip-shaped portion in solder film 116c according to Variation 2 as shown in FIG. 33. As described above, the first strip-shaped portion extending in the direction parallel to first direction D1 is disposed on the second surface 102 side, so that it is possible to suppress the solder from flowing out to second surface 102.

Furthermore, the example in which the solder film has a plurality of strip-shaped portions having a substantially constant width has been described in the above description. However, the widths of the plurality of strip-shaped portions may not necessarily be uniform. Hereinafter, an example in which the widths of the plurality of strip-shaped portions are not uniform will be described with reference to the drawings.

Figure 34A:
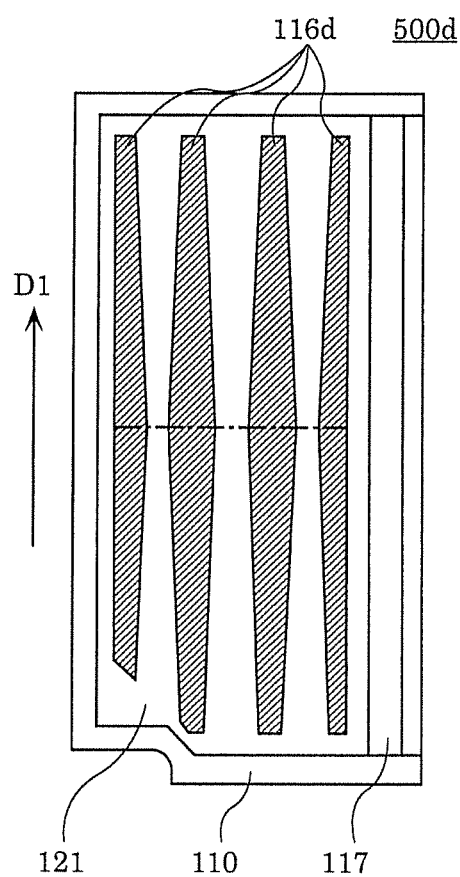
FIG. 34A is a plan view showing the shape of the solder film of the submount according to Variation 3 of Embodiment 2.
Figure 34B:
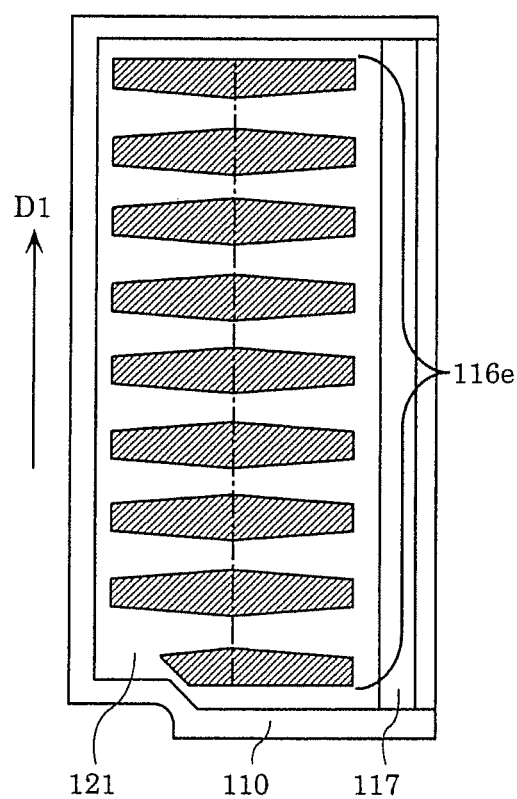
FIG. 34B is a plan view showing the shape of the solder film of the submount according to Variation 4 of Embodiment 2.
Figure 34C:
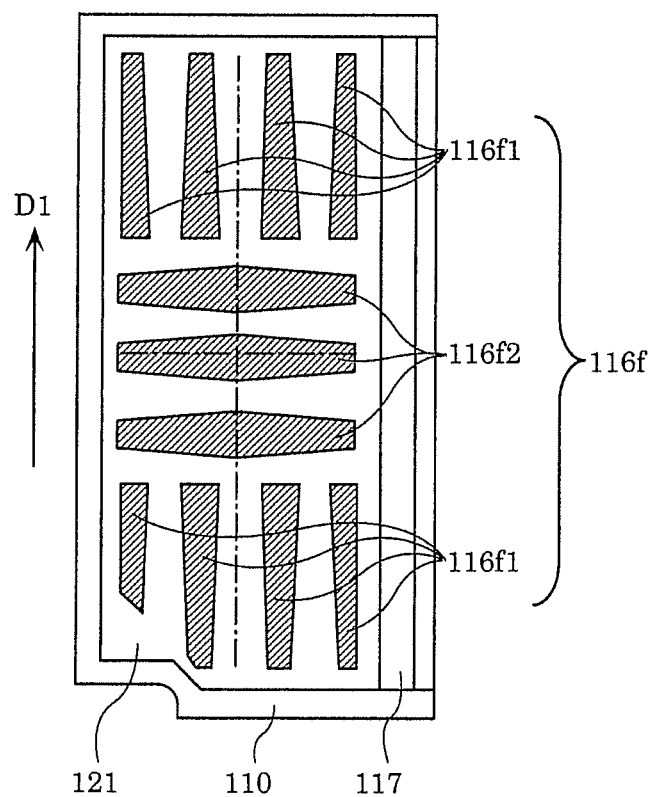
FIG. 34C is a plan view showing the shape of the solder film of the submount according to Variation 5 of Embodiment 2.

FIG. 34A is a plan view showing the shape of solder film 116d of submount 500d according to Variation 3 of the present embodiment. FIG. 34B is a plan view showing the shape of solder film 116e of submount 500e according to Variation 4 of the present embodiment. FIG. 34C is a plan view showing the shape of solder film 116f of submount 500f according to Variation 5 of the present embodiment. In FIGS. 34A to 34C, only the portion where the solder film is formed and the periphery thereof are shown in each submount.

As shown in FIG. 34A, each of the plurality of strip-shaped portions of solder film 116d according to Variation 3 of the present embodiment extends in a direction parallel to the first direction, and the width is not uniform. In the example shown in FIG. 34A, the width at the center in the longitudinal direction of each strip-shaped portion is larger than the width at the end portion in the longitudinal direction. In other words, each of the plurality of strip-shaped portions of solder film 116d has a tapered shape in which the width becomes narrower toward the outside from the center of the region where the plurality of strip-shaped portions are disposed. Further in other words, the width of each strip-shaped portion increases as it approaches the center of the region where solder film 116d is formed. Thereby, since the amount of solder in proximity to the end portion of solder film 116d can be reduced, the flow-out of solder can be suppressed. In addition, since the width of the strip-shaped portion in the central portion of solder film 116d is larger than the width of the strip-shaped portion in the end portion, the gap in the bonding portion can be reduced. Therefore, according to solder film 116d according to this Variation, the bonding strength can be increased.

In addition, even in such a case that the width of each of the plurality of strip-shaped portions of solder film 116 is not uniform, the direction in which the plurality of strip-shaped portions extends is not particularly limited similarly to Variations 1 and 2 of the present embodiment described above. As in solder film 116e according to Variation 4 of the present embodiment shown in FIG. 34B, the plurality of strip-shaped portions may extend in the direction perpendicular to the first direction. The positions of the end portions of the plurality of strip-shaped portions on the fourth surface 104 side may be farther from fourth surface 104 as they are disposed closer to second surface 102 along the shape of second notch part 113b. Furthermore, as in solder film 116f according to Variation 5 of the present embodiment shown in FIG. 34C, the plurality of strip-shaped portions may extend in a plurality of directions. For example, solder film 116f includes solder film 116f1 having a plurality of strip-shaped portions extending in a direction parallel to first direction D1, and solder film 116f2 having a plurality of strip-shaped portions extending in a direction that intersects first direction D1.

Furthermore, an example in which a plurality of strip-shaped portions of the solder film are separated from each other has been described in the above description, but the plurality of strip-shaped portions may not necessarily be separated from each other. Hereinafter, an example in which at least a part of a plurality of strip-shaped portions of the solder film is connected will be described with reference to the drawings.

Figure 35:
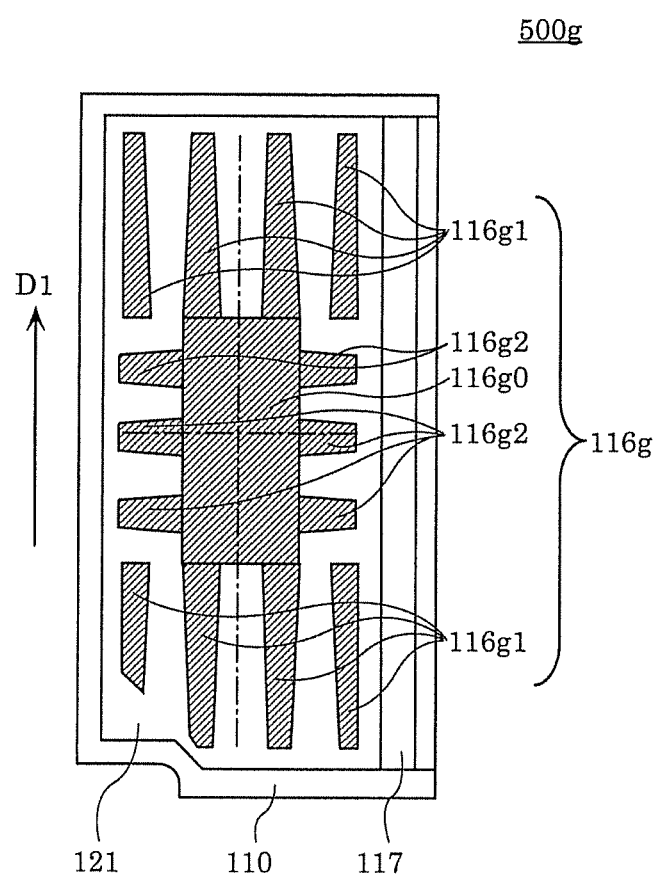
FIG. 35 is a plan view showing the shape of the solder film of the submount according to Variation 6 of Embodiment 2.

FIG. 35 is a plan view showing the shape of solder film 116g of submount 500g according to Variation 6 of the present embodiment.

As shown in FIG. 35, solder film 116g included in submount 500g according to Variation 6 includes solder films 116g0, 116g1, and 116g2. Solder film 116g0 is one sheet-like solder film that is disposed in the center of the region where solder film 116g is formed. Solder film 116g1 is disposed outside solder film 116g0 in a region where solder film 116g is formed, and has a plurality of strip-shaped portions extending in a direction parallel to first direction D1. Solder film 116g2 is disposed outside solder film 116g0 in the region where solder film 116g is formed, and has a plurality of strip-shaped portions extending in a direction perpendicular to first direction D1. In addition, at least a part of solder films 116g1 and 116g2 is connected to solder film 116g0. Similarly to the solder film according to the present embodiment and each Variation, it is possible to suppress the flow-out of solder and to increase the bonding strength also with such solder film 116g. Furthermore, since this Variation includes sheet-like solder film 116g0 that is disposed in the center of the region where solder film 116g is formed, the bonding strength can be further increased. Moreover, since solder film 116g0 is disposed in the center of the region where solder film 116g is formed, the solder of solder film 116g0 is difficult to flow out.

Variations, Etc.

As mentioned above, although the submount according to the present disclosure has been explained based on an embodiment, the present disclosure is not limited to the embodiments described above.

For example, embodiments obtained by subjecting the embodiments to various variations conceived by those skilled in the art, and embodiments realized by arbitrarily combining the components and functions in each embodiment without departing from the spirit of the present disclosure are also included in this disclosure.

For example, in Embodiment 2, each submount having a patterned solder film had a notch structure. However, a submount that has a solder film that suppresses the flow-out of solder and has good bonding strength does not necessarily have any notch structure. Hereinafter, a submount having a patterned solder film and not having any notch structure will be described with reference to the drawings.

Figure 36:
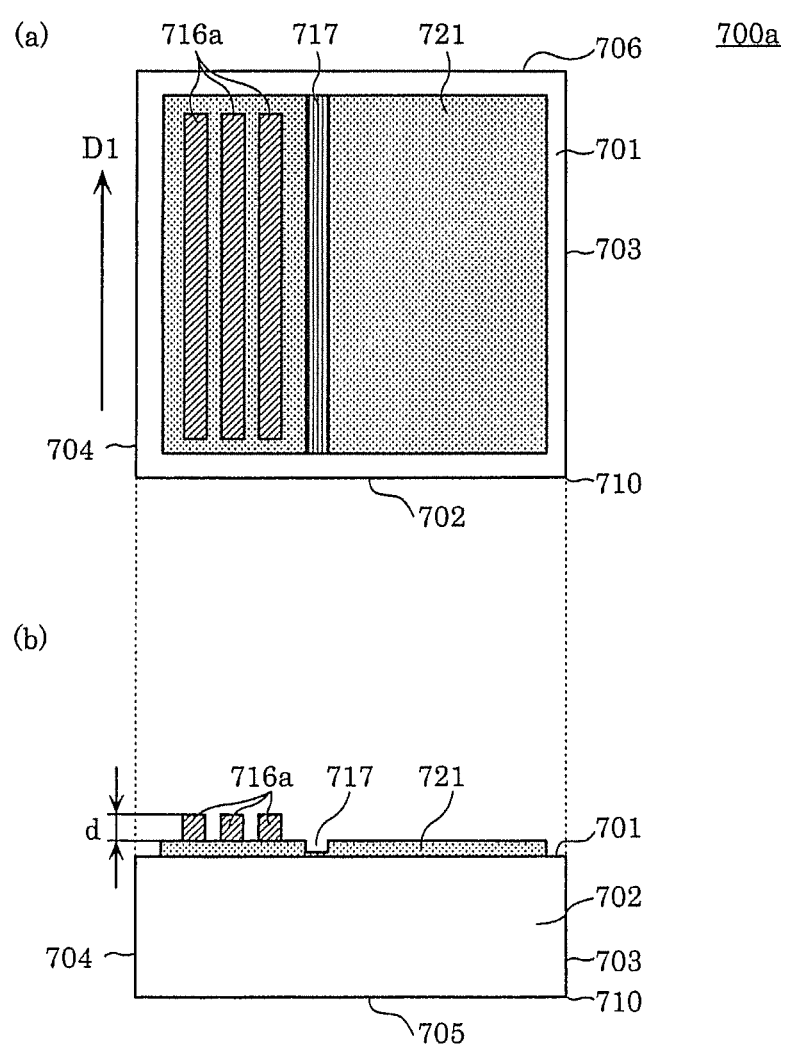
FIG. 36 is a diagram showing a structure of the submount according to Variation 1.

FIG. 36 is a diagram showing the structure of submount 700a according to first Variation. In FIG. 36, a plan view (a) and a front view (b) are shown.

As shown in FIG. 36, submount 700a according to Variation 1 includes substrate 710 having first surface 701 on which an element is mounted. Substrate 710 has second surface 702 that is disposed in first direction D1 in in-plane direction of first surface 701 and substantially perpendicular to first surface 701; third surface 703 that is substantially perpendicular to first surface 701 and second surface 702; fourth surface 704 that is substantially perpendicular to first surface 701 and second surface 702 and is opposed to third surface 703; fifth surface 705 that is substantially perpendicular to second surface 702, third surface 703, and fourth surface 704 and is opposed to first surface 701; and sixth surface 706 that is opposed to second surface 702.

In addition, submount 700a has first metal film 721 on first surface 701 and patterned solder film 716a. Solder film 716 is disposed on first metal film 721. First metal film 721 has a configuration similar to first metal film 121 according to Embodiment 2. Furthermore, a strip-shaped metal film removal portion 717 extending in first direction D1 is formed in first metal film 721. Metal film removal portion 717 has a configuration similar to metal film removal portion 117 according to Embodiment 2.

That is, submount 700a is different from submount 500a according to Embodiment 2 in that it does not have a notch structure, and is identical in other points.

Solder film 716a has a shape similar to solder film 116a according to Embodiment 2. Therefore, according to solder film 716a, since the amount of solder can be reduced as compared with solder film 116 according to Embodiment 1, the flow-out of solder can be suppressed. On the other hand, film thickness d of solder film 716a shown in the front view (b) of FIG. 36 can be equivalent to the film thickness of solder film 116 according to Embodiment 1. Furthermore, it is possible to suppress a decrease in bonding strength due to the small width of each of the plurality of strip-shaped portions by arranging the plurality of strip-shaped portions in the width direction.

Furthermore, the configuration of the patterned solder film of submount 700a according to Variation 1 is not limited to the configuration of solder film 716a. Hereinafter, an example in which the configuration of the solder film in submount 700a is replaced will be described with reference to the drawings.

Figure 37:
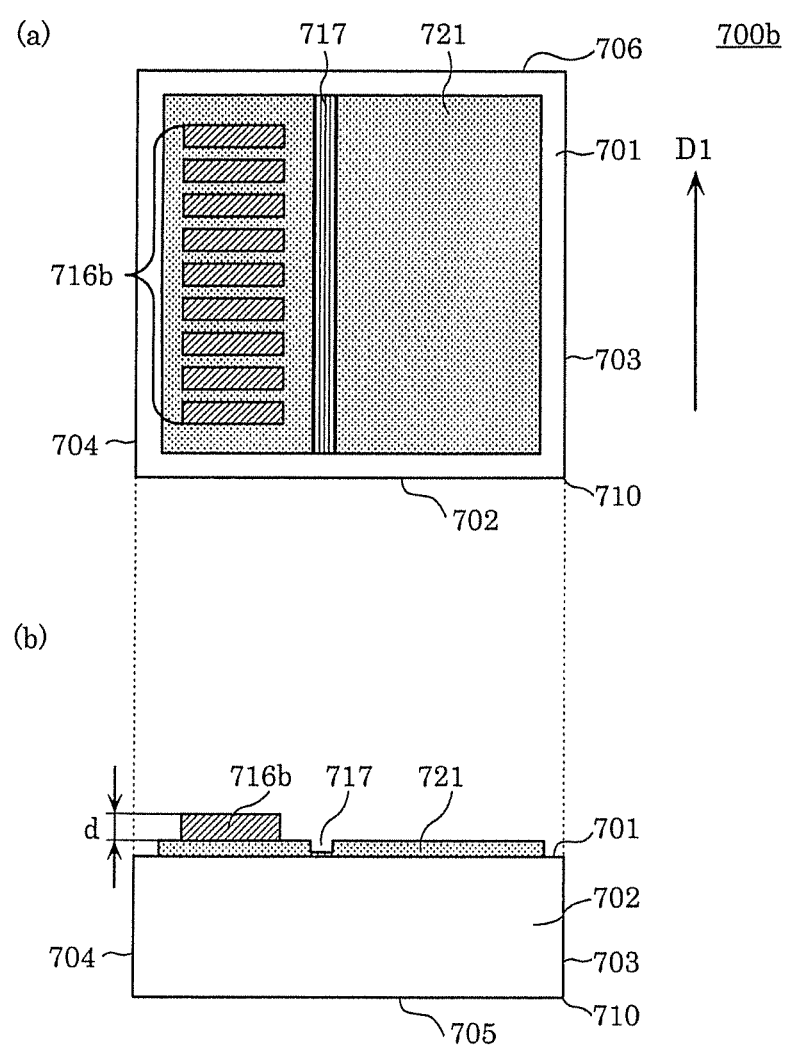
FIG. 37 is a diagram showing the structure of the submount according to Variation 2.
Figure 38:
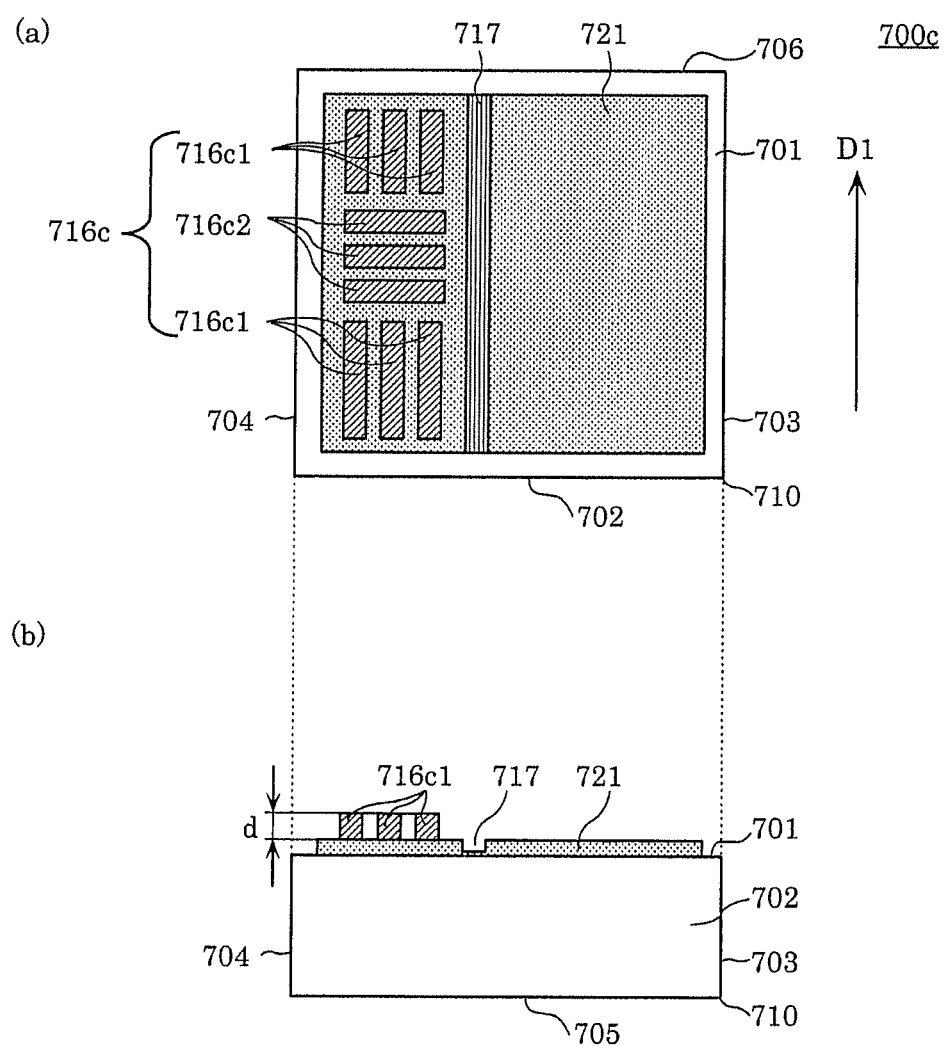
FIG. 38 is a diagram showing the structure of the submount according to Variation 3.

FIG. 37 is a diagram showing a structure of submount 700b according to Variation 2. FIG. 38 is a diagram showing a structure of submount 700c according to Variation 3. In FIGS. 37 and 38, plan views (a) and front views (b) are shown.

Submount 700b according to Variation 2 shown in FIG. 37 has solder film 716b. Since solder film 716b has a shape similar to the shape of solder film 116b according to Variation 1 of Embodiment 2 described above, the effects similar to solder film 116b can be obtained.

In addition, submount 700c according to Variation 3 shown in FIG. 38 has solder film 716c. Since solder film 716c has a shape similar to solder film 116c according to Variation 2 of Embodiment 2 described above, the effects similar to solder film 116c can be achieved.

Furthermore, submount 100 in which the surface roughness of second surface 102 used as the mounting surface is reduced has the notch structure in Embodiment 1. However, the submount in which the surface roughness of the mounting surface can be reduced does not necessarily have any notch structure. Hereinafter, a submount in which the surface roughness of the mounting surface can be reduced and which has no notch structure will be described with reference to the drawings.

Figure 39:
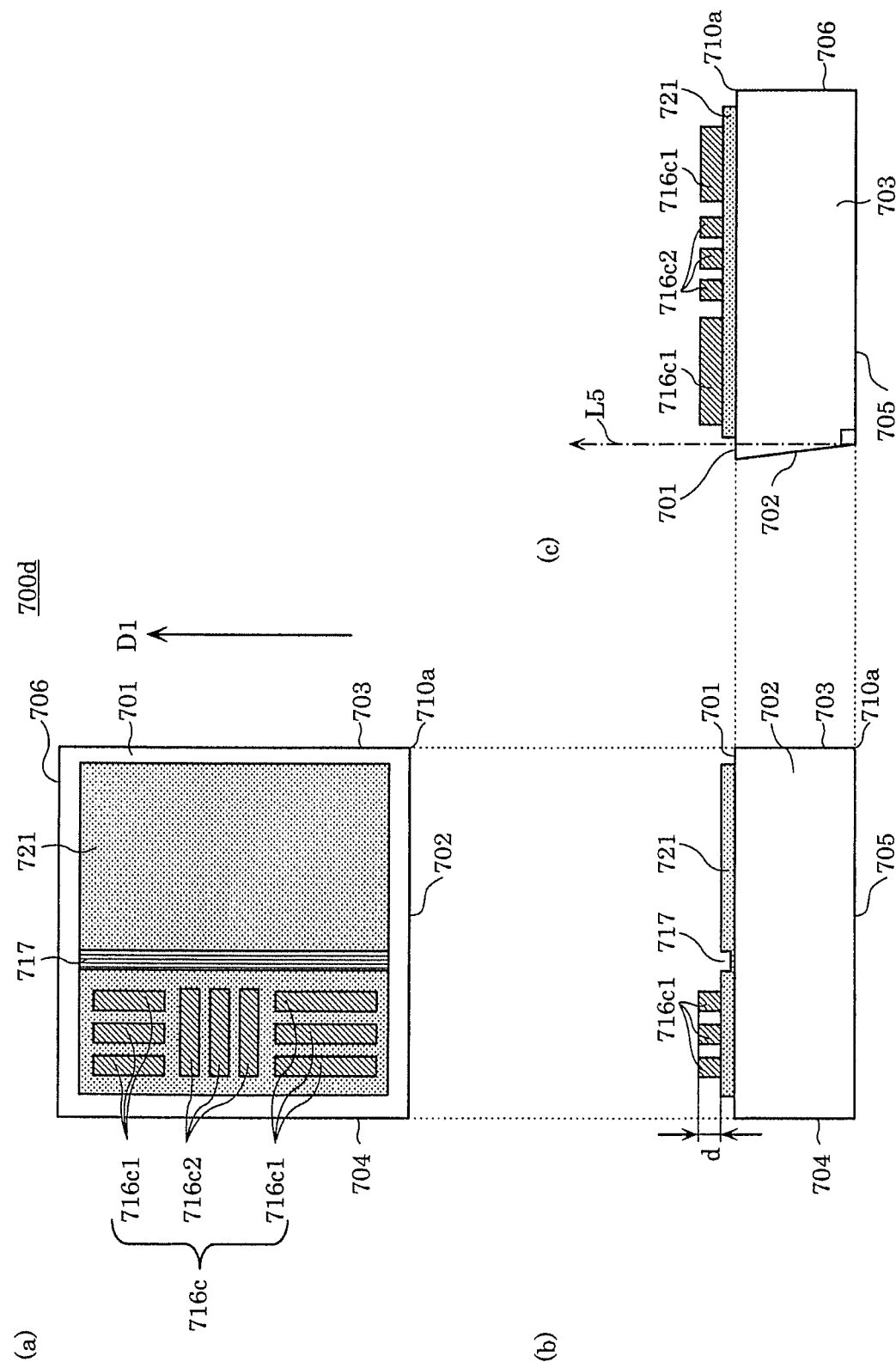
FIG. 39 is a diagram showing the structure of the submount according to Variation 4.

FIG. 39 is a diagram showing the structure of submount 700d according to Variation 4. In FIG. 39, a plan view (a), a front view (b), and a side view (c) of submount 700d according to Variation 4 are shown.

As shown in FIG. 39, submount 700d according to Variation 4 includes substrate 710a having first surface 701 on which an element is mounted. Substrate 710a has second surface 702 that is disposed in first direction D1 in in-plane direction of first surface 701 and substantially perpendicular to first surface 701; third surface 703 that is substantially perpendicular to first surface 701 and second surface 702; fourth surface 704 that is substantially perpendicular to first surface 701 and second surface 702 and is opposed to third surface 703; fifth surface 705 that is substantially perpendicular to second surface 702, third surface 703, and fourth surface 704 and is opposed to first surface 701; and sixth surface 706 that is opposed to second surface 702. In addition, second surface 702 is inclined with respect to the direction of normal L5 of fifth surface 705.

That is, substrate 710a of submount 700d is different from substrate 110 of submount 100a according to Embodiment 1 or the like in that it has no notch structure, and is identical in other points. Therefore, since submount 700d according to Variation 4 has second surface 702 having a small surface roughness, similarly to submount 100a according to Embodiment 1, it is possible to increase the bonding strength by using second surface 702 as the mounting surface.

Furthermore, submount 700d has solder film 716c patterned in the same manner as solder film 716c of submount 700c according to Variation 3 described above. Thereby, solder film 716 of submount 700d can achieve the effects similar to solder film 716c of submount 700c according to Variation 3 described above.

Furthermore, similarly to the above embodiment, the present disclosure also includes a semiconductor laser device including each submount according to Variations 1 to 4 and semiconductor laser chip 152.

In addition, similarly to the above embodiment, the present disclosure also includes a heat assisted hard disk device including each submount according to Variations 1 to 4, semiconductor laser chip 152, and slider 602.

Furthermore, in each submount according to the above embodiment, the shape of the curved surface in the notch structure is not necessarily limited to the circular arc shape in cross section. For example, curved surface 115 may have a parabolic curved surface in a cross section.

Figure 40:
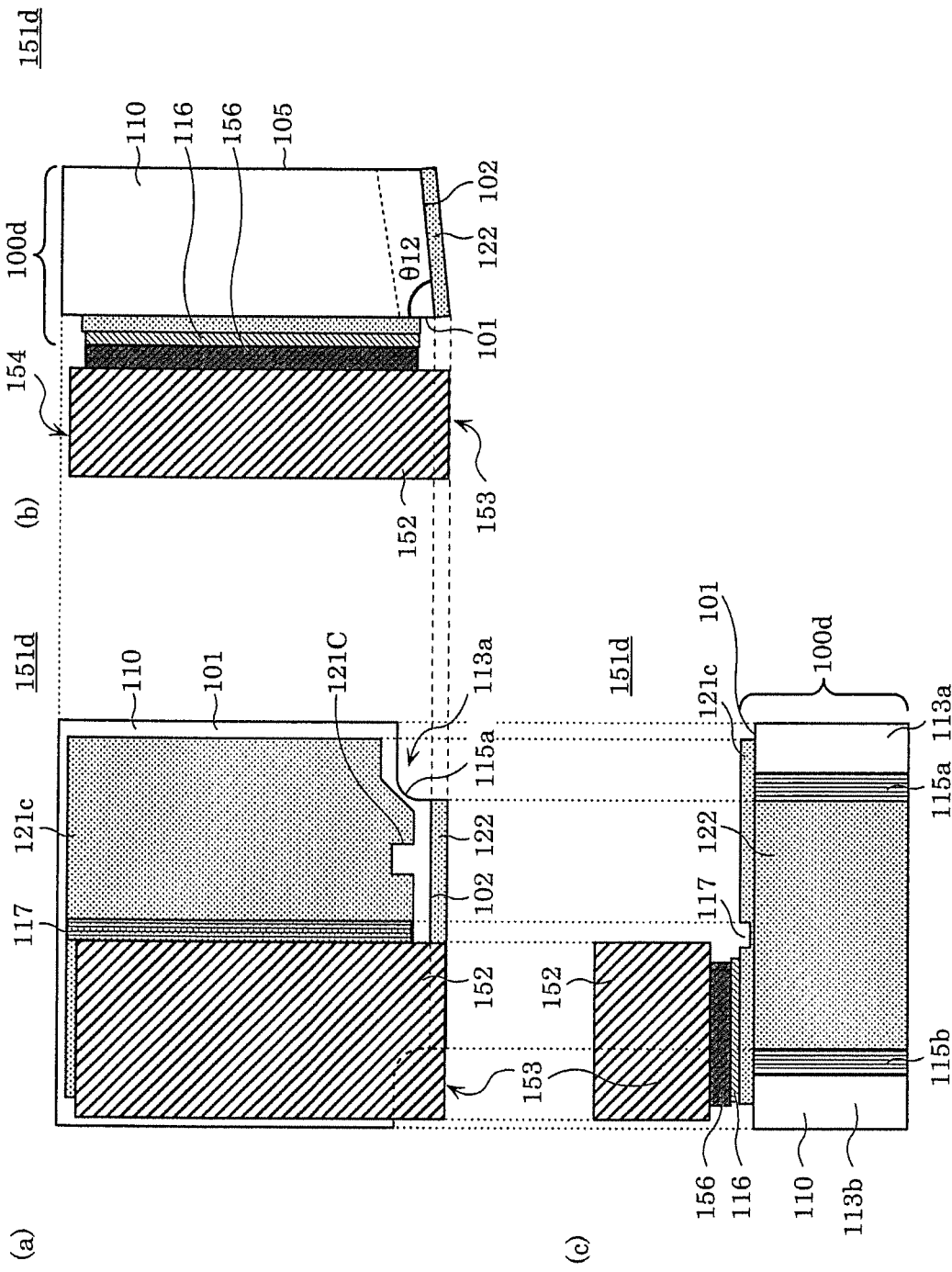
FIG. 40 is a trihedral view showing the outer shape of the semiconductor laser device including the submount according to Variation 1 of Embodiment 1.

In addition, first metal film 121 that is disposed on first surface 101 in submount 100 is not limited to the feature of each of the above embodiments. Here, an example of the feature of the first metal film will be described with reference to FIG. 40. FIG. 40 is a trihedral view showing an outer shape of semiconductor laser device 151d including submount 100d according to Variation 1 of Embodiment 1. Semiconductor laser device 151d shown in FIG. 40 is different from semiconductor laser device 151 according to Embodiment 1 in the configuration of first metal film 121c of submount 100d, and is identical in other points. As shown in FIG. 40, first metal film 121c has notch 121C at the outer edge portion in a plan view. The shape of notch 121C is not particularly limited, but is a rectangular shape in the present variations.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The submount according to the present disclosure is particularly applicable to a semiconductor laser device and a heat assisted hard disk device that require a bonding strength with a semiconductor laser chip.

What is claimed is:

1. A submount comprising a substrate including a first surface on which an element is mounted, wherein
the substrate includes:
a second surface that is disposed in a first direction in an in-plane direction of the first surface and substantially perpendicular to the first surface;
a third surface that is substantially perpendicular to the first surface and the second surface;
a fourth surface that is substantially perpendicular to the first surface and the second surface and is opposed to the third surface;
a fifth surface that is substantially perpendicular to the second surface, the third surface, and the fourth surface and is opposed to the first surface;
a sixth surface that is opposed to the second surface;
a first notch part that is provided in a portion at which the second surface and the third surface are adjacent to each other; and
a second notch part that is provided in a portion at which the second surface and the fourth surface are adjacent to each other, wherein
the first notch part and the second notch part have a recessed surface that includes a curved surface, and
the radius of the curved surface is 5 μm or more in a cross section of the curved surface parallel to the first surface.

2. The submount according to claim 1, wherein
the first notch part has a seventh surface that is substantially parallel to the second surface in proximity to the third surface.

3. The submount according to claim 1, wherein
a shape of a cross section of the curved surface parallel to the first surface is an arc shape having a radius of 5 μm or more in the first notch part.

4. The submount according to claim 1, wherein
in the first surface, a side on a third surface side is spaced apart by 10 μm or more, and a side on a second surface side is spaced apart by 20 μm or more from an intersection of an extension line of the third surface and an extension line of the second surface when seen in a plan view from a first surface side.

5. The submount according to claim 1, wherein
the third surface comprises a peripheral surface and an inner surface inside the peripheral surface wherein the peripheral surface is adjacent to the first notch part, the fifth surface, and the sixth surface, and a surface roughness of the peripheral surface is smaller than a surface roughness of the inner surface.

6. The submount according to claim 1, wherein
the fifth surface has a surface roughness Ra of 0.2 μm or less, and a material included in the substrate is exposed.

7. The submount according to claim 1, wherein
the second surface is inclined with respect to a normal direction of the fifth surface, and
an angle between the first surface and the second surface is an acute angle.

8. The submount according to claim 7, comprising:
a second metal film that is disposed on the second surface, wherein
a film thickness of the second metal film increases from the first surface toward the fifth surface.

9. A semiconductor laser device, comprising:
the submount according to claim 1; and
a semiconductor laser chip bonded onto the first surface of the submount via a solder film, wherein
an emission surface of the semiconductor laser chip is disposed on a second surface side.

10. The semiconductor laser device according to claim 9, wherein
the semiconductor laser chip is disposed across at least one of the first notch part or the second notch part when seen in a plan view from a first surface side.

11. A semiconductor laser device, comprising:
the submount according to claim 7, the submount including a solder film that is disposed on the first surface and a second metal film that is disposed on the second surface; and
a semiconductor laser chip bonded to the first surface of the submount via the solder film, wherein
an emission surface of the semiconductor laser chip is disposed on a second surface side, and
the surface of the second metal film and the emission surface are substantially parallel.

12. The semiconductor laser device according to claim 11, wherein
a thickness of the solder film changes along the first direction.

13. The semiconductor laser device according to claim 12, wherein
the thickness of the solder film on the second surface side is smaller than a thickness of the solder film on the sixth surface side.

14. A heat assisted hard disk device, comprising:
the semiconductor laser device according to claim 9; and
a slider on which the semiconductor laser device is mounted.

15. The submount according to claim 1, further comprising:
a solder film that is disposed on the first surface, wherein
the solder film has a plurality of strip-shaped portions disposed in parallel.

16. The submount according to claim 15, wherein
the plurality of strip-shaped portions are separated from each other.

17. The submount according to claim 15, wherein
the plurality of strip-shaped portions extend in a direction parallel to the first direction.

18. A submount comprising a substrate including a first surface on which an element is mounted, wherein the substrate includes:
a second surface that is disposed in a first direction in an in-plane direction of the first surface and substantially perpendicular to the first surface;
a third surface that is substantially perpendicular to the first surface and the second surface;
a fourth surface that is substantially perpendicular to the first surface and the second surface and is opposed to the third surface;
a fifth surface that is substantially perpendicular to the second surface, the third surface, and the fourth surface and is opposed to the first surface;
a sixth surface that is opposed to the second surface;
a first notch part that is provided in a portion at which the second surface and the third surface are adjacent to each other; and
a second notch part that is provided in a portion at which the second surface and the fourth surface are adjacent to each other, and
wherein the first notch part and the second notch part have a recessed surface that includes a curved surface, and
in the first surface, a side on a third surface side is spaced apart by 10 μm or more, and a side on a second surface side is spaced apart by 20 μm or more from an intersection of an extension line of the third surface and an extension line of the second surface when seen in a plan view from a first surface side.

19. A semiconductor laser device comprising:
a submount including:
a substrate including:
a first surface on which an element is mounted;
a second surface that is disposed in a first direction in an in-plane direction of the first surface and substantially perpendicular to the first surface;
a third surface that is substantially perpendicular to the first surface and the second surface;
a fourth surface that is substantially perpendicular to the first surface and the second surface and is opposed to the third surface;
a fifth surface that is substantially perpendicular to the second surface, the third surface, and the fourth surface and is opposed to the first surface;
a sixth surface that is opposed to the second surface;
a first notch part that is provided in a portion at which the second surface and the third surface are adjacent to each other;
a second notch part that is provided in a portion at which the second surface and the fourth surface are adjacent to each other; and
a solder film that is disposed on the first surface and a second metal film that is disposed on the second surface, and
a semiconductor laser chip bonded to the first surface of the submount via the solder film, wherein the first notch part and the second notch part have a recessed surface that includes a curved surface, the second surface is inclined with respect to a normal direction of the fifth surface, an angle between the first surface and the second surface is an acute angle, an emission surface of the semiconductor laser chip is disposed on a second surface side, and the surface of the second metal film and the emission surface are substantially parallel.

20. The semiconductor laser device according to claim 19, wherein the solder film has a plurality of strip-shaped portions disposed in parallel.

\* \* \* \* \*